(12) United States Patent
Shental et al.

(10) Patent No.: US 11,991,034 B1
(45) Date of Patent: May 21, 2024

(54) SAMPLE-LEVEL ERROR-CORRECTING CODE

(71) Applicant: QUALCOMM Incorporated, San Diego, CA (US)

(72) Inventors: Ori Shental, Marlboro, NJ (US); Meilong Jiang, Westfield, NJ (US); Ashwin Sampath, Skillman, NJ (US); Ahmed Bedewy, Hillsborough, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/053,986

(22) Filed: Nov. 9, 2022

(51) Int. Cl.
*H04L 27/26* (2006.01)
*H03M 13/15* (2006.01)
*H03M 13/00* (2006.01)

(52) U.S. Cl.
CPC ...... *H04L 27/2628* (2013.01); *H03M 13/156* (2013.01); *H03M 13/611* (2013.01)

(58) Field of Classification Search
CPC .......................... H04L 27/2628; H03M 13/156
See application file for complete search history.

(56) References Cited

U.S. PATENT DOCUMENTS

| | | | | |
|---|---|---|---|---|
| 5,959,967 A * | 9/1999 | Humphrey | .......... | H04L 27/0004 370/208 |
| 6,072,769 A * | 6/2000 | Ho | .......... | H04L 5/023 370/525 |
| 10,826,649 B1 | 11/2020 | Yu et al. | | |
| 2002/0133528 A1 * | 9/2002 | Zolti | .......... | H04M 11/062 718/100 |
| 2004/0042543 A1 | 3/2004 | Li et al. | | |
| 2010/0226448 A1 | 9/2010 | Dent | | |
| 2014/0064419 A1 * | 3/2014 | Arambepola | ....... | H04L 27/2691 375/349 |
| 2014/0119351 A1 | 5/2014 | Yonge, III et al. | | |
| 2016/0352419 A1 | 12/2016 | Fonseka et al. | | |
| 2017/0163296 A1 | 6/2017 | Terry et al. | | |
| 2021/0364599 A1 * | 11/2021 | Roger | ..................... | G01S 7/356 |
| 2021/0364622 A1 * | 11/2021 | Roger | ..................... | G01S 7/356 |
| 2022/0151023 A1 | 5/2022 | Damnjanovic | | |
| 2023/0288574 A1 * | 9/2023 | Conflitti | ................. | G01S 19/37 342/357.25 |

OTHER PUBLICATIONS

AJR Simpson, Deep Transform: Time-Domain Audio Error Correction via Probabilistic Re-Synthesis; Computer Science, ArXiv; Published Mar. 19, 2015 (Year: 2015).*

Copper Mountain Technologies and Eravant; Time domain analysis with Copper mountain technologies vector network analyzers (VNA); Sep. 20, 2019 (Year: 2019).*

(Continued)

*Primary Examiner* — Joseph D Torres
(74) *Attorney, Agent, or Firm* — Harrity & Harrity, LLP

(57) ABSTRACT

A first wireless communication device may encode real samples of data to obtain encoded data based at least in part on adding one or more time domain complex samples to the real samples of the data. A function of the one or more time domain complex samples may be a known value, and the function may be a sum of exponentials of the one or more time domain complex samples. The first wireless communication device may transmit, to a second wireless communication device, the encoded data.

30 Claims, 11 Drawing Sheets

(56) References Cited

OTHER PUBLICATIONS

International Search Report and Written Opinion—PCT/US2023/074647—ISA/EPO—Jan. 15, 2024.
Marshall T.G., et al., "Coding of Real-No. Sequences for Error Correction: A Digital Signal Processing Problem", IEEE Journal on Selected Areas in Communications, vol. 2, No. 2, Mar. 1, 1984, XP093114952, pp. 381-392, abstract, sections II, III, section VI.C.
Vaezi M., et al., "Distributed Lossy Source Coding Using Real-No. Codes", Vehicular Technology Conference (VTC Fall), 2012 IEEE, Sep. 3, 2012, XP032294791, 5 pages, section III.

* cited by examiner

SAMPLE-LEVEL ERROR-CORRECTING CODE

FIELD OF THE DISCLOSURE

Aspects of the present disclosure generally relate to wireless communication and to techniques and apparatuses associated with sample-level error-correcting code.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a first wireless communication device for wireless communication. The first wireless communication device may include a memory and one or more processors coupled to the memory. The one or more processors may be configured to encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples. The one or more processors may be configured to transmit, to a second wireless communication device, the encoded data.

Some aspects described herein relate to a first wireless communication device for wireless communication. The first wireless communication device may include a memory and one or more processors coupled to the memory. The one or more processors may be configured to receive, from a second wireless communication device, encoded data including a set of complex samples. The one or more processors may be configured to decode the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

Some aspects described herein relate to a method of wireless communication performed by a first wireless communication device. The method may include encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples. The method may include transmitting, to a second wireless communication device, the encoded data.

Some aspects described herein relate to a method of wireless communication performed by a first wireless communication device. The method may include receiving, from a second wireless communication device, encoded data including a set of complex samples. The method may include decoding the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

Some aspects described herein relate to a non-transitory computer-readable medium that stores a set of instructions by a first wireless communication device. The set of instructions, when executed by one or more processors of the first wireless communication device, may cause the first wireless communication device to encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples. The set of instructions, when executed by one or more processors of the first wireless communication device, may cause the first wireless communication device to transmit, to a second wireless communication device, the encoded data.

Some aspects described herein relate to a non-transitory computer-readable medium that stores a set of instructions by a first wireless communication device. The set of instructions, when executed by one or more processors of the first wireless communication device, may cause the first wireless communication device to receive, from a second wireless communication device, encoded data including a set of complex samples. The set of instructions, when executed by one or more processors of the first wireless communication device, may cause the first wireless communication device to decode the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

Some aspects described herein relate to an apparatus. The apparatus may include means for encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples. The apparatus may include means for transmitting, to a second wireless communication device, the encoded data.

Some aspects described herein relate to an apparatus. The apparatus may include means for receiving, from a second wireless communication device, encoded data including a set of complex samples. The apparatus may include means for decoding the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

Aspects generally include a method, apparatus, system, computer program product, non-transitory computer-readable medium, user equipment, base station, network entity, network node, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure, by way of example only, and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

Figure 1:
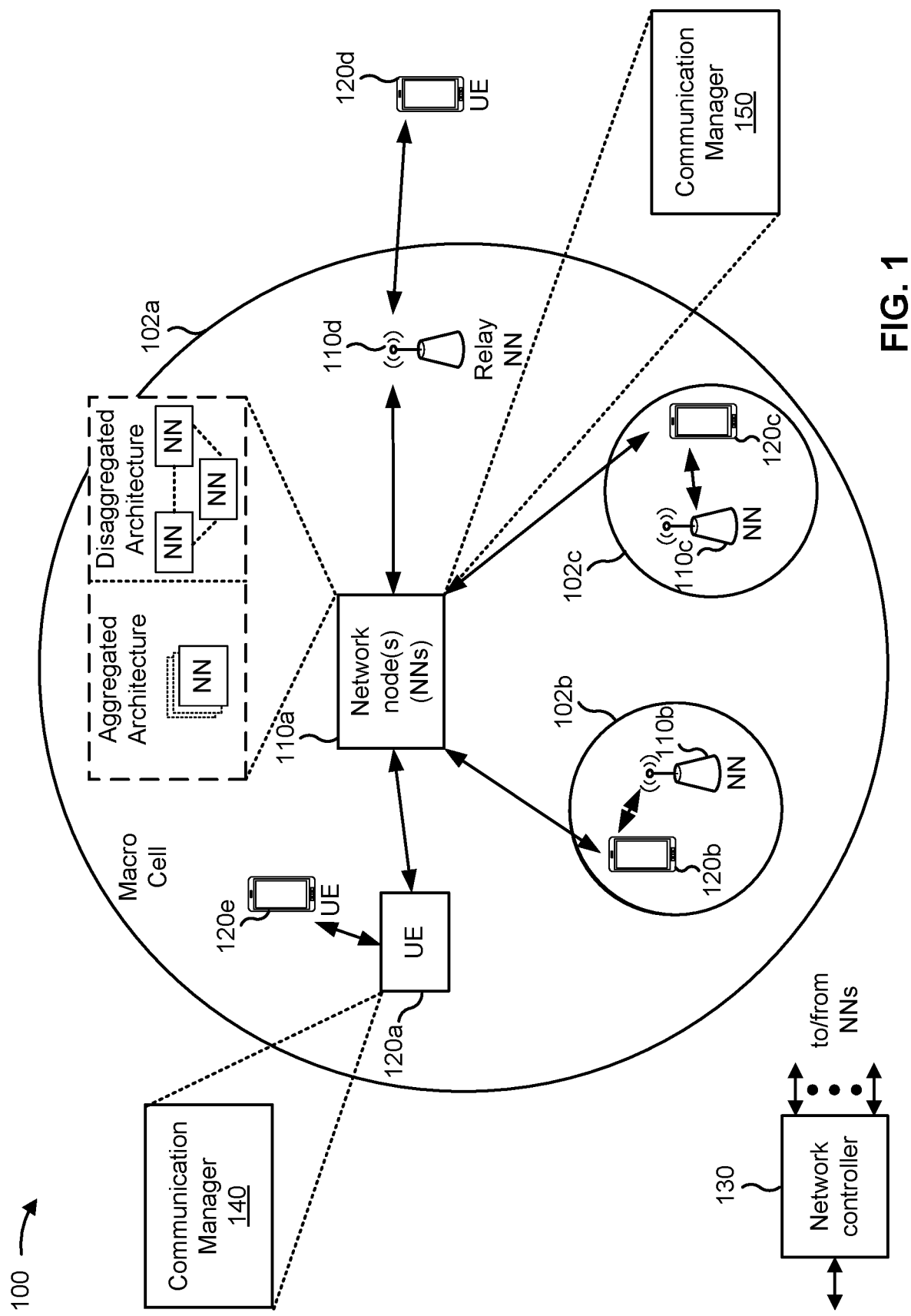
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110a may be a macro network node for a macro cell 102a, the network node 110b may be a pico network node for a pico cell 102b, and the network node 110c may be a femto network node for a femto cell 102c. A network node may support one or multiple (e.g., three) cells. In some examples, a cell may not necessarily be stationary, and the geographic area of the cell may move according to the location of a network node 110 that is mobile (e.g., a mobile network node).

In some aspects, the term "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the term "base station" or "network node" may refer to one device configured to perform one or more functions, such as those described herein in connection with the network node 110. In some aspects, the term "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the term "base station" or "network node" may refer to any one or more of those different devices. In some aspects, the term "base station" or "network node" may refer to one or more virtual base stations or one or more virtual base station functions. For example, in some aspects, two or more base station functions may be instantiated on a single device. In some aspects, the term "base station" or "network node" may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110d (e.g., a relay network node) may communicate with the network node 110a (e.g., a macro network node) and the UE 120d in order to facilitate communication between the network node 110a and the UE 120d. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network node, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, a first wireless communication device may include a communication manager 140 or a communication manager 150. As described in more detail elsewhere herein, the communication manager 140 or the communication manager 150 may encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and transmit, to a second wireless communication device, the encoded data. Additionally, or alternatively, the communication manager 140 or the communication manager 150 may perform one or more other operations described herein.

In some aspects, as described in more detail elsewhere herein, the communication manager 140 or the communication manager 150 may receive, from a second wireless communication device, encoded data including a set of complex samples; and decode the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples. Additionally, or alternatively, the communication manager 140 or the communication manager 150 may perform one or more other operations described herein.

As indicated above, FIG. 1 is provided as an example. Other examples may differ from what is described with regard to FIG. 1.

Figure 2:
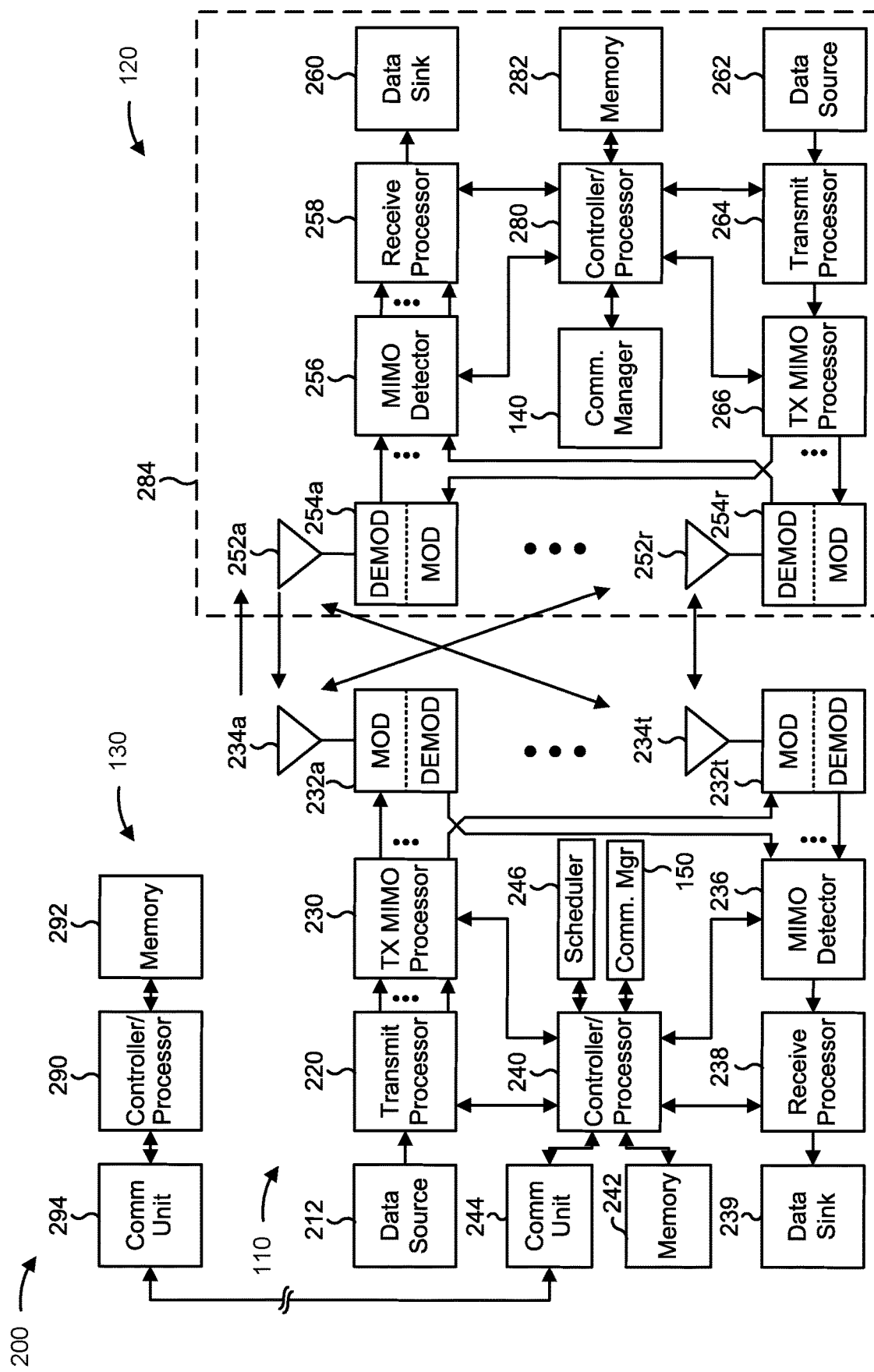
FIG. 2 is a diagram illustrating an example of a network node in communication with a user equipment (UE) in a wireless network, in accordance with the present disclosure.

FIG. 2 is a diagram illustrating an example 200 of a network node 110 in communication with a user equipment (UE) 120 in a wireless network 100, in accordance with the present disclosure. The network node 110 may be equipped with a set of antennas 234a through 234t, such as T antennas (T≥1). The UE 120 may be equipped with a set of antennas 252a through 252r, such as R antennas (R≥1). The network node 110 of example 200 includes one or more radio frequency components, such as antennas 234 and a modem 254. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The network node 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 6-11).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 6-11).

The controller/processor 240 of the network node 110, the controller/processor 280 of the UE 120, and/or any other component(s) of FIG. 2 may perform one or more techniques associated with sample-level error-correcting code, as described in more detail elsewhere herein. In some aspects, the wireless communication device described herein is the network node 110, is included in the network node 110, and/or includes one or more components of the network node 110 shown in FIG. 2. In some aspects, the wireless communication device described herein is the UE 120, is included in the UE 120, and/or includes one or more components of the UE 120 shown in FIG. 2.

Figure 8:
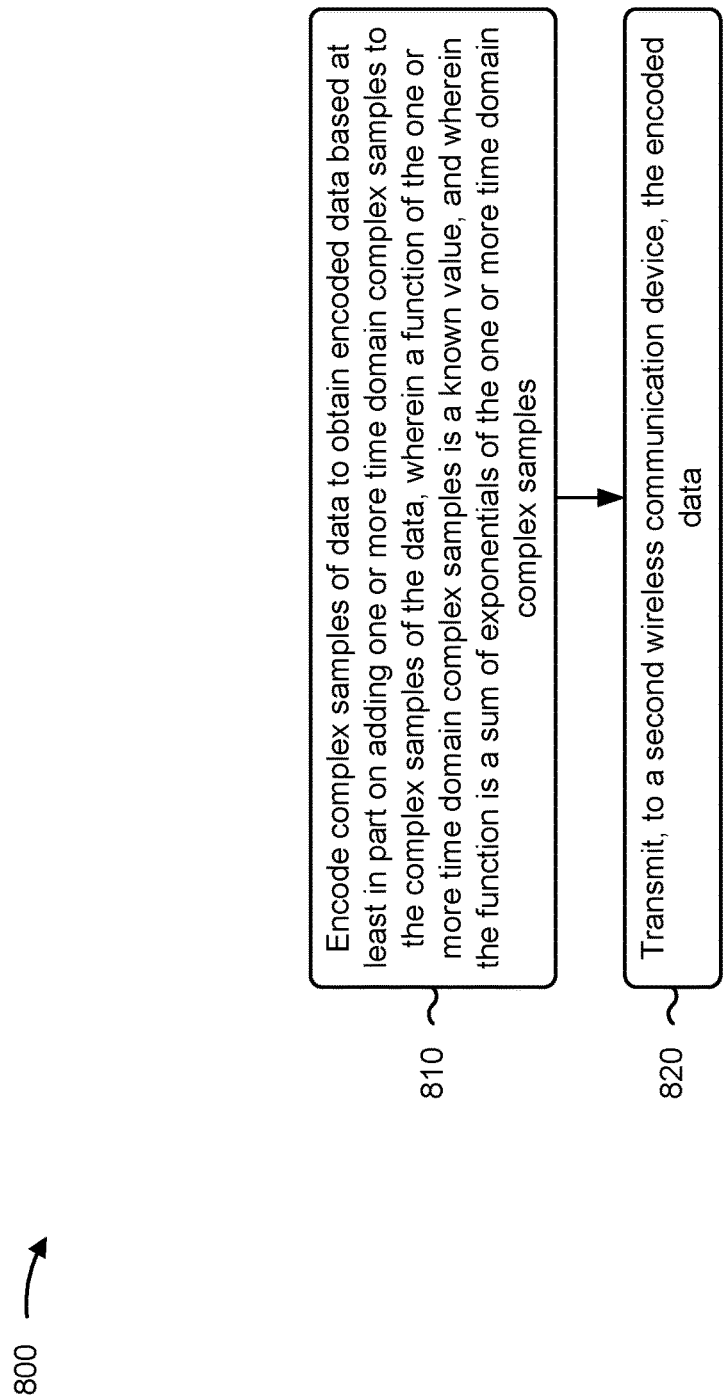
FIG. 8 is a diagram illustrating an example process performed, for example, by a first wireless communication device, in accordance with the present disclosure.
Figure 9:
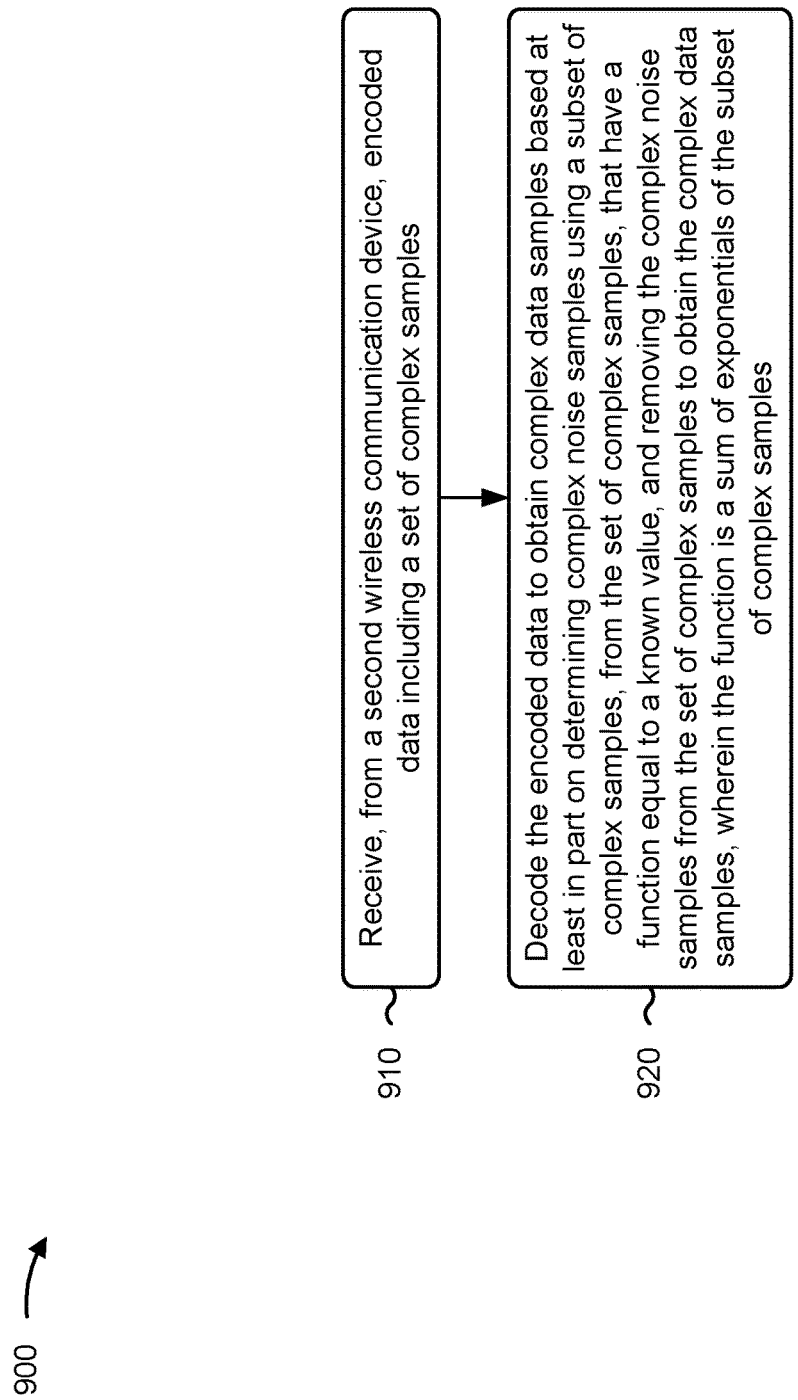
FIG. 9 is a diagram illustrating an example process performed, for example, by a first wireless communication device, in accordance with the present disclosure.

For example, the controller/processor 240 of the network node 110, the controller/processor 280 of the UE 120, and/or any other component(s) of FIG. 2 may perform or direct operations of, for example, process 800 of FIG. 8, process 900 of FIG. 9, and/or other processes as described herein. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 800 of FIG. 8, process 900 of FIG. 9, and/or other processes as described herein. In some examples, executing instructions may include running the instructions, converting the instructions, compiling the instructions, and/or interpreting the instructions, among other examples.

In some aspects, a first wireless communication device includes means for encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and/or means for transmitting, to a second wireless communication device, the encoded data. In some aspects, the means for the first wireless communication device to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the first wireless communication device to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the first wireless communication device includes means for receiving, from a second wireless communication device, encoded data including a set of complex samples; and/or means for decoding the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples. In some aspects, the means for the first wireless communication device to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the first wireless communication device to perform operations described herein may include, for example, one or more of communication manager 140, antenna 252, modem 254, MIMO detector 256, receive processor 258, transmit processor 264, TX MIMO processor 266, controller/processor 280, or memory 282.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR base station, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 3:
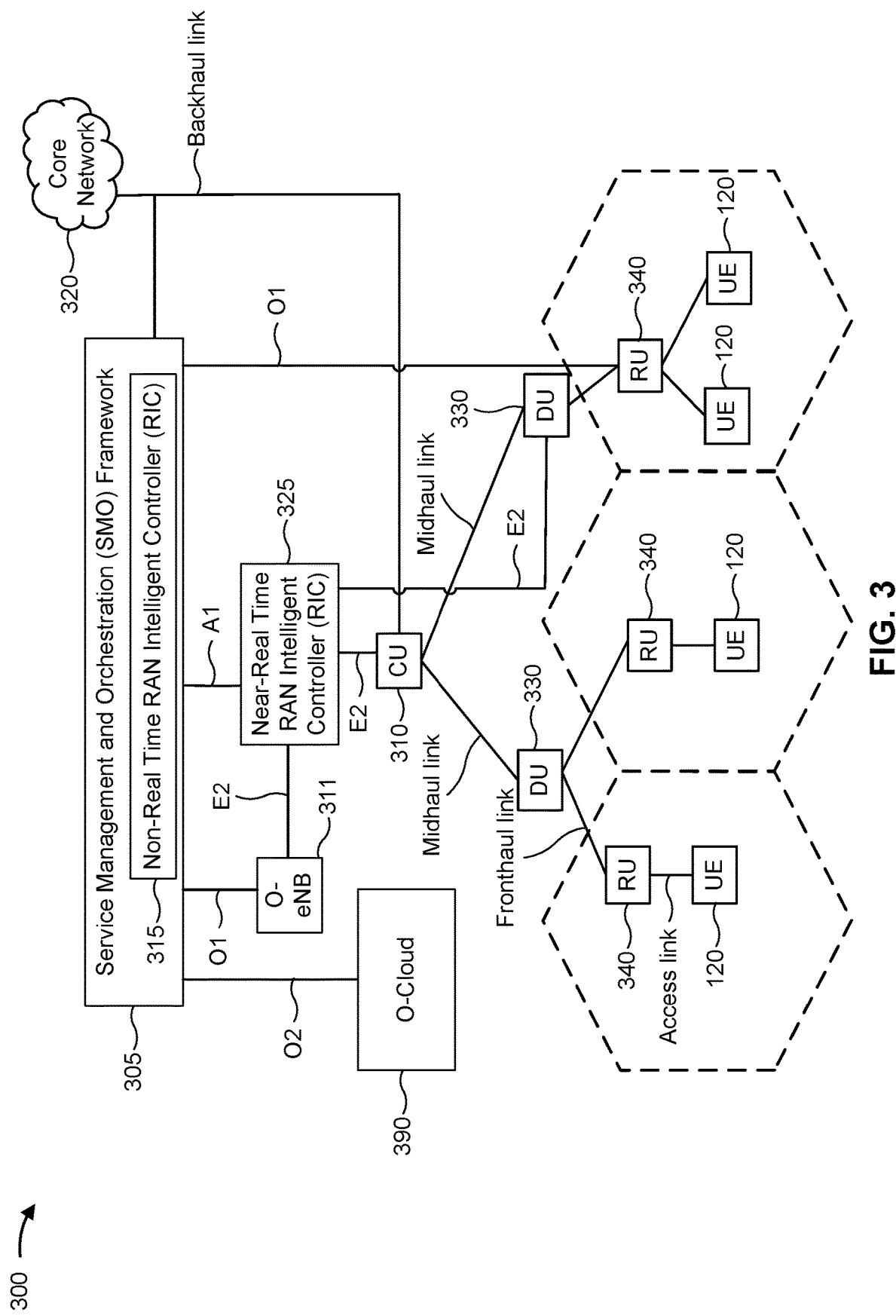
FIG. 3 is a diagram illustrating an example disaggregated base station architecture, in accordance with the present disclosure.

FIG. 3 is a diagram illustrating an example disaggregated base station architecture 300, in accordance with the present disclosure. The disaggregated base station architecture 300 may include a CU 310 that can communicate directly with a core network 320 via a backhaul link, or indirectly with the core network 320 through one or more disaggregated control units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as through F1 interfaces. Each of the DUs 330 may communicate with one or more RUs 340 via respective fronthaul links. Each of the RUs 340 may communicate with one or more UEs 120 via respective radio frequency (RF) access links. In some implementations, a UE 120 may be simultaneously served by multiple RUs 340.

Each of the units, including the CUs 310, the DUs 330, the RUs 340, as well as the Near-RT RICs 325, the Non-RT RICs 315, and the SMO Framework 305, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 310. The CU 310 may be configured to handle user plane functionality (for example, Central Unit—User Plane (CU-UP) functionality), control plane functionality (for example, Central Unit—Control Plane (CU-CP) functionality), or a combination thereof. In some implementations, the CU 310 can be logically split into one or more CU-UP units and one or more CU-CP units. A CU-UP unit can communicate bidirectionally with a CU-CP unit via an interface, such as the E1 interface when implemented in an O-RAN configuration. The CU 310 can be implemented to communicate with a DU 330, as necessary, for network control and signaling.

Each DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 330 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 330, or with the control functions hosted by the CU 310.

Each RU 340 may implement lower-layer functionality. In some deployments, an RU 340, controlled by a DU 330, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 340 can be operated to handle over the air (OTA) communication with one or more UEs 120. In some implementations, real-time and non-real-time aspects of control and user plane communication with the RU(s) 340 can be controlled by the corresponding DU 330. In some scenarios, this configuration can enable each DU 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements, which may be managed via an operations and maintenance interface (such as an O1 interface). For virtualized network elements, the SMO Framework 305 may be configured to interact with a cloud computing platform (such as an open cloud (O-Cloud) platform 390) to perform network element life cycle management (such as to instantiate virtualized network elements) via a cloud computing platform interface (such as an O2 interface). Such virtualized network elements can include, but are not limited to, CUs 310, DUs 330, RUs 340, non-RT RICs 315, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with each of one or more RUs 340 via a respective O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT MC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (such as reconfiguration via an O1 interface) or via creation of RAN management policies (such as A1 interface policies).

As indicated above, FIG. 3 is provided as an example. Other examples may differ from what is described with regard to FIG. 3.

Figure 4:
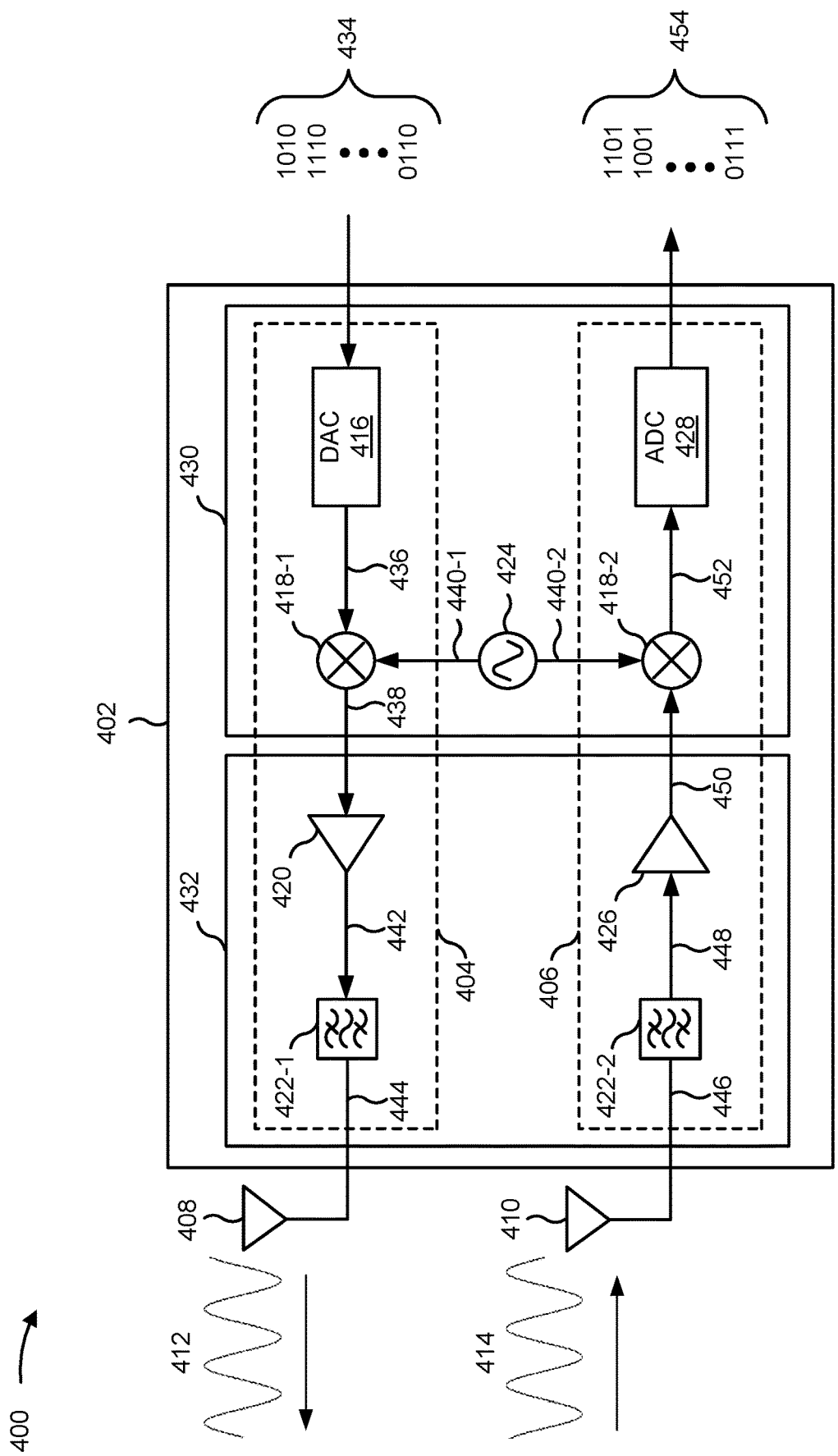
FIG. 4 is a diagram illustrating an example of a wireless transceiver that may be used by a device to communicate in a wireless network, in accordance with the present disclosure.

FIG. 4 is a diagram illustrating an example 400 of a wireless transceiver 402 that may be used by a device to communicate in a wireless network, in accordance with the present disclosure. In some examples, the wireless transceiver 402 may include, or be included in, one or more components as described in connection with FIG. 2. For example, one or more components of the wireless transceiver 402 may be coupled to, and/or included in, the modem 232 (e.g., one or more of the modems 232a through 232t) and/or the modem 254 (e.g., one or more of the modems 254a through 254r). As another example, the wireless transceiver 402 may include, or be included in, one or more components described in connection with FIGS. 10 and 11.

A wireless transceiver 402 may include a transmitter 404 (shown with a dashed line) and/or a receiver 406 (shown with a dashed line). As an example, the receiver may be, or may be included in, the reception component 1002 described in connection with FIG. 10, and/or the reception component 1102 described in connection with FIG. 11. Similarly, the transmitter may be, or may be included in, the transmission component 1004 described in connection with FIG. 10, and/or the transmission component 1104 described in connection with FIG. 11. As shown by the example 400, the transmitter 404 may be coupled to at least a first antenna 408, and the receiver 406 may be coupled to at least a second antenna 410. However, in other examples, the transmitter 404 and the receiver 406 may be coupled to a same antenna through a switch and/or duplexer. In some examples, the transmitter 404 may generate and transmit an outgoing RF signal 412, and the receiver 406 may receive and process an incoming RF signal 414.

As shown by the example 400, the transmitter 404 may include a digital-to-analog converter 416 (DAC 416), a first mixer 418-1, a first amplifier 420 (e.g., a power amplifier), and/or a first filter 422-1 (e.g., a surface-acoustic-wave (SAW) filter), among other examples. The first mixer 418-1 may be coupled to a local oscillator (LO) 424. In some examples, the DAC 416 may be coupled to an application processor or another processor associated with the wireless transceiver 402 (e.g., the modem 232 or the modem 254).

Other examples of a transmitter may include multiple DACs, multiple mixers, multiple amplifiers, and/or multiple filters that are not shown by the example 400.

The receiver 406 may include a second filter 422-2 (e.g., a SAW filter), a second amplifier 426 (e.g., a low-noise amplifier), a second mixer 418-2, and/or an analog-to-digital converter 428 (ADC 428), among other examples. The second mixer 418-2 may be coupled to the LO 424. Alternatively, or additionally, the ADC 428 may be coupled to an application processor or another processor associated with the wireless transceiver 402 (e.g., the modem 232 or the modem 254). Other examples of a receiver may include multiple filters, multiple amplifiers, multiple mixers, and/or multiple ADCs that are not shown by the example 400.

In some examples, the wireless transceiver 402 may be implemented using multiple circuits, such as multiple integrated circuits (ICs). For example, the wireless transceiver 402 may include a transceiver circuit 430 and a radio-frequency front-end (RFFE) circuit 432. Accordingly, components associated with the transmitter 404 and the receiver 406 may be distributed across the multiple circuits. As one example, the transceiver circuit 430 and the RFFE circuit 432 may each include at least some components that form the transmitter 404 and/or at least some components that form the receiver 406. For example, with regard to the transmitter 404, the transceiver circuit 430 may include the DAC 416 and the first mixer 418-1 of the transmitter 404, and the RFFE circuit 432 may include the first amplifier 420 and the first filter 422-2 of the transmitter 404. Additionally, or alternatively, with regard to the receiver 406, the transceiver circuit 430 may include the second mixer 418-2 and the ADC 428 of the receiver 406, and the RFFE circuit 432 may include the second filter 422-2 and the second amplifier 426 of the receiver 406. In some examples, the DAC 416 and/or the ADC 428 may be implemented on a circuit separate from the transceiver circuit 430, such as the modem 232 or the modem 254.

In some examples, the transmitter 404 may generate the outgoing RF signal 412 based at least in part on one or more digital samples 434. A "digital sample," which may alternatively be referred to as a sample, may be a representation of an analog signal, such as an amplitude representation of the analog signal at a point in time. Each sample of a set of samples that span a time duration may represent the analog signal at a different point in time within the time duration. For example, a first sample may represent the signal at a first point in time, a second sample may represent the signal at a second, different point in time, up to an $n^{th}$ sample that may represent the signal at an $n^{th}$ point in time, where n is an integer and represents the points in time that span the time duration may be uniformly separated in time. In some examples, a sample may capture an in-phase/quadrature (I/Q) signal. For example, a sample may include an in-phase component (I-component) value associated with the I/Q signal at the point in time and a quadrature component (Q-component) value at the point in time. A sample associated with an I/Q signal (e.g., that includes an I-component and a Q-component) may be referred to as a "complex sample" and/or a "real sample." As another example, complex samples and/or real samples may be associated with constellation symbols and/or log-likelihood ratios (LLRs), among other examples, that are associated with a signal.

In some cases, such as for higher order modulation, a bit tuple (e.g., binary tuple) may be mapped to a constellation or modulation symbol to achieve an improved (e.g., larger) spectral efficiency. The bit tuple may be an ordered tuple with a domain in the set {0,1}. The bit tuple that is mapped to the constellation or modulation symbol may result in a spectral efficiency that is greater than binary phase shift keying (BPSK). In some cases, depending on how each bit in the bit tuple is mapped to a respective constellation point, the reliability of the bits may be different by a certain amount. In a 64 quadrature amplitude modulation (QAM) example (e.g., six bits maps to one constellation point), conditioned on the last four bits, the first two bits may form a quadrature phase shift keying (QPSK) constellation and can be decoded with high reliability (e.g., provided that the receiver is configured with information associated with the last 4 bits).

In some examples, the DAC 416 may receive, as the digital sample(s) 434, one or more samples associated with a pre-upconversion signal (e.g., a baseband signal or an intermediate frequency (IF) signal). The first mixer 418-1 may receive the analog pre-upconversion signal 436 as input, and generate, as an output, a prefiltered upconverted signal 438 using an LO signal 440-1 provided by the LO 424. The prefiltered upconverted signal 438 may be an RF signal and/or may include some noise and/or unwanted frequencies, such as a harmonic frequency. The first amplifier 420 may receive the prefiltered upconverted signal 438 and generate an amplified prefiltered signal 442.

The first filter 422-2 may receive the amplified prefiltered signal 442 as input and filter the amplified pre-filter transmit signal 442 to generate a filtered transmit signal 444. As part of the filtering process, the first filter 422-2 may attenuate the noise or unwanted frequencies included in the prefiltered upconverted signal 438 and/or the amplified prefiltered signal 442. The transmitter 404 may provide the filtered transmit signal 444 to the first antenna 408 for transmission as the outgoing RF signal 412.

In some examples, the receiver 406 may receive the incoming RF signal 414 using the second antenna 410. As shown by the example 400, the second antenna 410 may generate a prefiltered receive signal 446. The second antenna 410 may be coupled to the second filter 422-2 such that the second filter 422-2 receives and filters the prefiltered receive signal 446 to remove noise and/or unwanted frequencies. Accordingly, the second filter 422-2 may generate a filtered receive signal 448.

The second amplifier 426 may receive and amplify the filtered receive signal 448 to generate an amplified filtered receive signal 450. Based at least in part on being coupled to the second amplifier 426, the second mixer 418-2 may receive the amplified filtered receive signal 450 and down-convert the amplified filtered receive signal 450 using a LO signal 440-2 (e.g., from the LO 424) to generate a down-converted receive signal 452, which may be a baseband signal or an IF signal. The ADC 428 may receive the downconverted receive signal 452 and generate a digital signal by generating one or more digital samples 454 as output. The one or more digital samples 454 may be processed by a processor associated with the wireless transceiver 402 and/or another processor, such as a processor associated with the modem 232 or the modem 254.

As indicated above, FIG. 4 is provided as an example. Other examples may differ from what is described with regard to FIG. 4.

Figure 5:
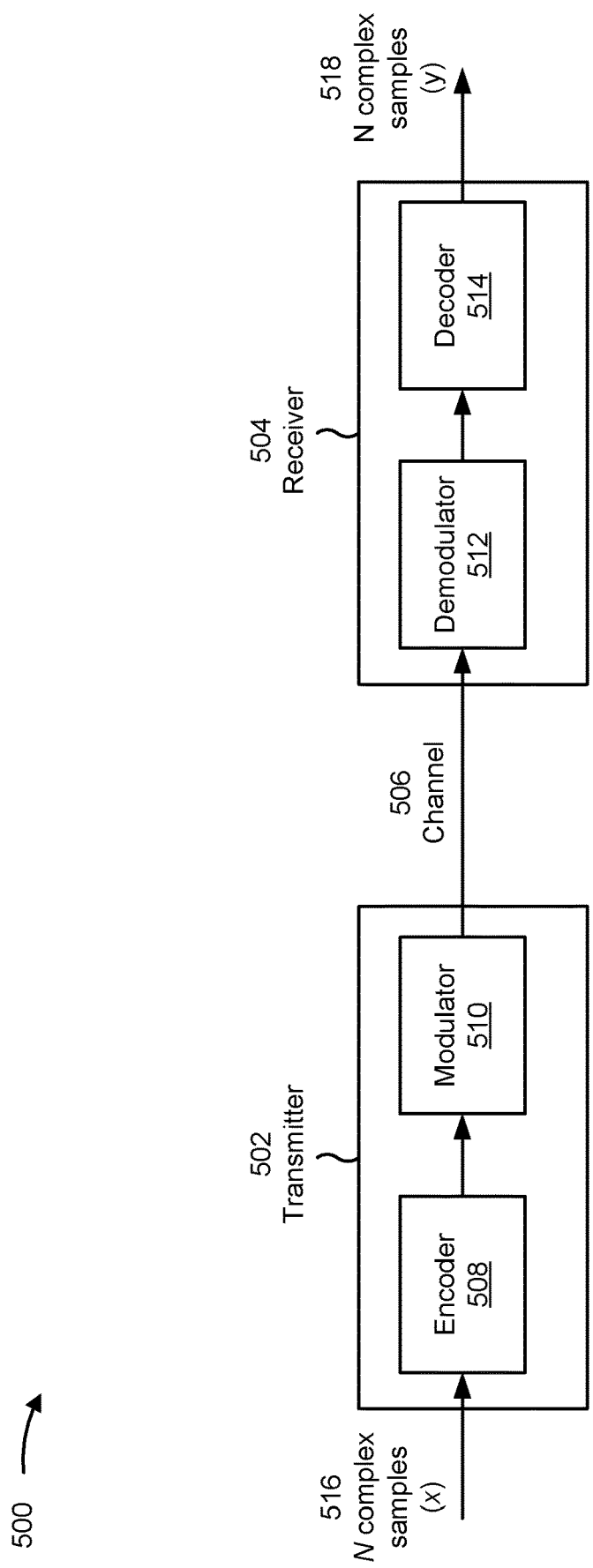
FIG. 5 is a diagram illustrating an example of encoding and decoding associated with wireless communication devices, in accordance with the present disclosure.

FIG. 5 is a diagram illustrating an example 500 of encoding and decoding associated with wireless communication devices, in accordance with the present disclosure. As shown in FIG. 5, a transmitter 502 (e.g., a UE 120, a network node 110, a CU, a DU, and/or an RU) may communicate with a receiver 504 (e.g., a UE 120, a network node 110, a CU, a DU, and/or an RU) via a channel 506. The channel 506 may be associated with a fronthaul link, a midhaul link, and/or an RF access link, among other examples.

A wireless communication system may use an encoding algorithm (e.g., forward error correction (FEC) encoding and decoding) to transmit data reliably between devices. As one example, FEC encoding and decoding may be associated with a low-density parity-check (LDPC) encoding algorithm or a Reed-Solomon encoding algorithm at the transmitter 502 which may encode a data stream with redundant information and/or error correction information such that the receiver 504 with a complementary LDPC or Reed-Solomon decoding algorithm may correct for recovery errors that are based at least in part on a distortion in the received signal. In some examples, "coding" may refer to both encoding at the transmitter 502 and complementary decoding at the receiver 504.

For example, the transmitter 502 may include an encoder 508 and a modulator 510. The receiver 504 may include a demodulator 512 and a decoder 514. The encoder 508 may implement FEC encoding, such as via an LDPC encoding algorithm and/or a Reed-Solomon encoding algorithm, among other examples. One or more (e.g., N) complex samples 516 may be obtained by the transmitter 502. A sample may refer to a sample (e.g., a time domain sample and/or a frequency domain sample) of a signal to be transmitted. A complex sample may represent a sample of a signal using a sum or difference of a real number and an imaginary number. The complex samples 516 may be converted into digital samples (e.g., one or more bits). The encoder 508 may receive the digital samples as an input and generate, as an output, one or more encoded bits based at least in part on applying FEC encoding. In some examples, the encoder 508 may implement multiple encoding algorithms and be programmed and/or instructed to use one of the multiple algorithms as the single encoding algorithm. The modulator 510 may receive the encoded bits as an input and may generate a modulated signal based at least in part on the encoded bits. For example, a QAM modulator may generate I/Q coefficients that are based at least in part on mapping the encoded bits to a constellation (e.g., a 16 QAM constellation, a 64 QAM constellation, or a 1024 QAM constellation).

The demodulator 512 may receive a modulated signal via the channel 506. In some examples, the modulated signal received by the receiver 504 (e.g., by the demodulator 512) may include distortion that causes the modulated signal to deviate from the modulated signal transmitted by the transmitter 502. For example, the signal may be transformed or changed while propagating through the channel 506. The demodulator 512 may demodulate the received signal to obtain one or more encoded bits. The demodulator 512 may recover one or more encoded bits based at least in part on processing the received modulated signal. For example, the demodulator 512 may be a QAM demodulator that includes an LLR calculator that recovers the encoded bits based at least in part on estimating points on a corresponding constellation. The decoder 514 may receive the encoded bits and recover one or more bits based at least in part on a decoding algorithm that is complementary to the encoding algorithm utilized by the encoder 508. By using the encoder 508 and the decoder 514, the transmitter 502 and the receiver 504 may reduce errors between the one or more (recovered) bits at the decoder 514 and the one or more (source) bits encoded at the encoder 508. The bits obtained at the decoder 514 may be converted to N complex samples 518. The encoder 508, the modulator 510, the demodulator 512, and/or the decoder 514 may be implemented using any combination of software, hardware, and/or firmware, such as via one or more components depicted and/or described in more detail elsewhere herein (such as in connection with FIGS. 2, 3, 10, and 11).

The FEC encoding and decoding implemented via the encoder 508 and the decoder 514 may be utilized to correct bit-level errors (e.g., errors associated with a value of a digital sample of a signal) introduced via the channel 506. However, in some cases (such as signals transmitted via a fronthaul link and/or a midhaul link) a data source of a signal may be complex samples (e.g., rather than digital samples). The FEC encoding and decoding implemented via the encoder 508 and the decoder 514 may not protect against errors caused to complex samples of a signal because the encoding and the decoding is applied to bits representing a signal (e.g., to digital samples). For example, the N complex samples 516 may be represented by X and the N complex samples 518 may be represented by Y, where $Y=X+N_I$. $N_I$ may be distortion (e.g., noise) introduced to the N complex samples via the channel 506. For example, one or more of the N complex samples may be different between the N complex samples 516 and the N complex samples 518. The FEC encoding and decoding implemented via the encoder 508 and the decoder 514 may be unable to identify and/or correct the errors caused to the one or more of the N complex samples.

As a result, the receiver 504 may obtain the N complex samples 518 (Y), which may be different than the N complex samples 516 (X) (e.g., the N complex samples 516 (X) which are the data source at the transmitter 502). This may reduce a performance, and/or reliability, among other examples, of communications via the channel 506. Additionally, the errors to the complex samples may result in retransmissions via the channel 506. The retransmissions may introduce latency associated with communications via the channel 506.

Some techniques and apparatuses described herein may enable sample-level (e.g., complex sample-level) error-correcting code. For example, a first wireless communication device (e.g., a transmitter) may encode real samples (e.g., complex samples) of data to obtain encoded data based at least in part on adding one or more time domain complex samples to the real samples of the data. In some aspects, a function of the one or more time domain complex samples (e.g., a sum of exponentials of the one or more time domain complex samples) may be a known value, such as zero. The first wireless device may transmit, to a second wireless communication device (e.g., a receiver), the encoded data.

The second wireless communication device may decode the encoded data to obtain complex samples of data (e.g., complex data samples) based at least in part on determining complex noise samples using a subset of complex samples, from the set of complex samples, that have a function equal to a known value. The complex noise samples may be associated with noise introduced via a channel and/or with errors introduced at the transmitter and/or the receiver. The second wireless communication device may remove the complex noise samples from the set of complex samples to obtain the complex data samples.

In some aspects, the second wireless communication device may decode the encoded data based at least in part on inputting the subset of complex samples and the known value into a curve fitting model, where an output of the curve fitting model is the complex noise samples. In some aspects, the curve fitting model may be a Prony model (e.g., the curve fitting model may utilize a Prony algorithm). In some aspects, decoding (e.g., whether to decode) the encoded data may be based at least in part on a quantity of the complex noise samples being less than or equal to half of a quantity of the subset of complex samples (e.g., to enable a result of the output of the curve fitting model to be reliable and/or accurate).

As a result, the second wireless communication device may be enabled to correct errors introduced to complex samples of data transmitted via a channel (e.g., a fronthaul link). For example, the second wireless communication device may be enabled to determine errors introduced to the complex samples of data (e.g., to determine the complex noise samples) using a subset of complex samples that have a function that is equal to a known value (e.g., exponentials of one or more time domain complex samples that sum to the known value). Because the first wireless communication device (e.g., an encoder and/or transmitter) encodes complex samples of the data by adding the one or more time domain complex samples to the complex samples of the data (e.g., that have a function equal to a known value), the second wireless communication device (e.g., a decoder and/or receiver) may be enabled to determine a function of noise of a channel as applied to the complex samples of the data. For example, a difference in a function of the received subset of complex samples from the known value may indicate the complex noise samples to be removed from the received complex samples. Because the received subset of complex samples (e.g., that correspond to the one or more time domain complex samples added by the first wireless communication device) have the function equal to the known value, the second wireless communication device (e.g., a decoder and/or receiver) may be enabled to identify the complex noise samples introduced in a transmission and/or reception of the data and remove the complex noise samples from the received complex samples.

Reducing errors to the complex samples of data transmitted via a channel may improve a performance, and/or reliability, among other examples, of communications via the channel. Additionally, reducing errors to the complex samples may result in less retransmissions via the channel. Reducing a quantity of retransmissions may reduce latency associated with communications via the channel.

As indicated above, FIG. 5 is provided as an example. Other examples may differ from what is described with regard to FIG. 5.

Figure 6:
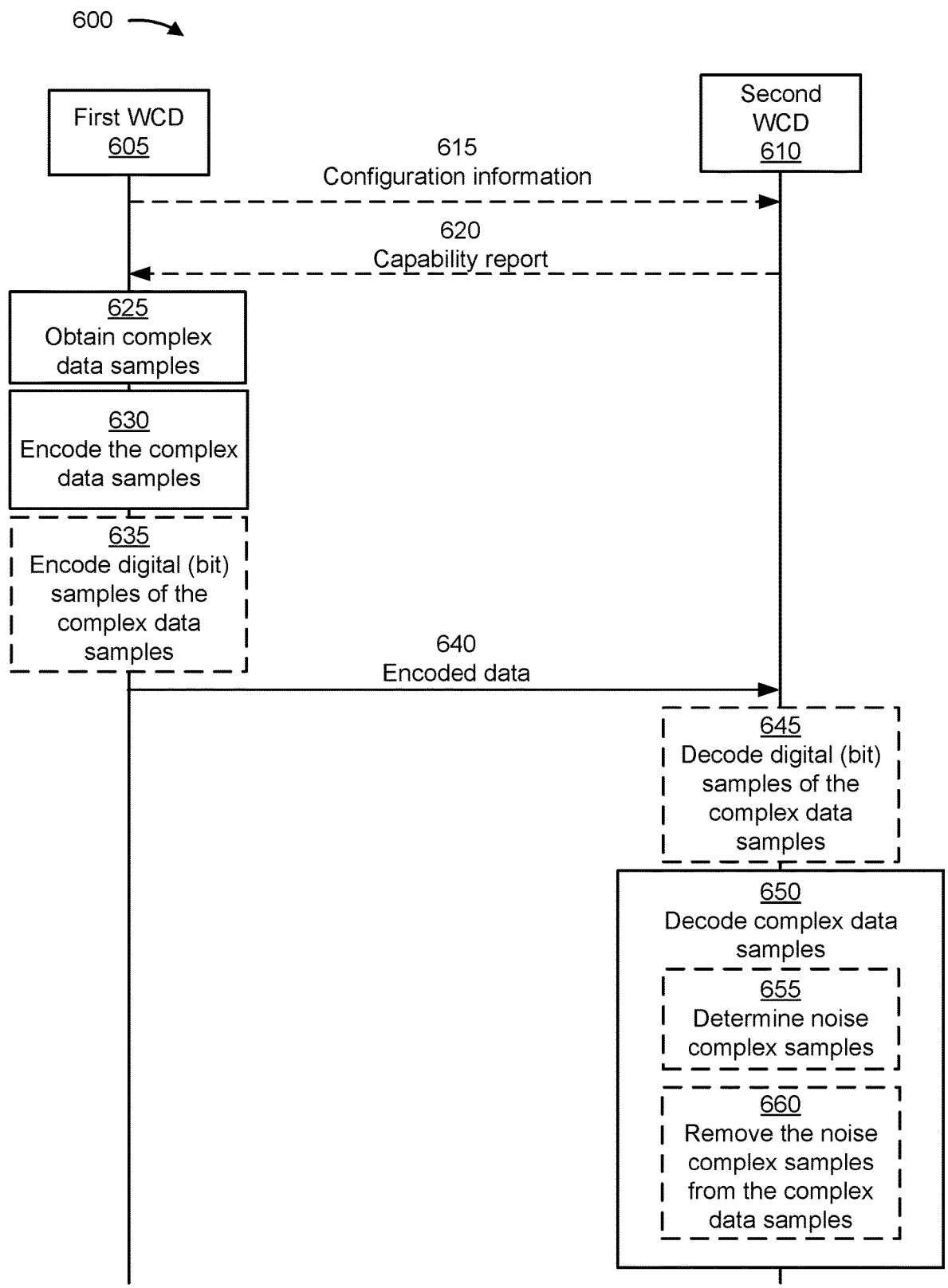
FIG. 6 is a diagram of an example associated with sample-level error-correcting code, in accordance with the present disclosure.

FIG. 6 is a diagram of an example 600 associated with sample-level error-correcting code, in accordance with the present disclosure. As shown in FIG. 6, a first wireless communication device (WCD) 605 (e.g., a UE 120, a network node 110, a CU, a DU, and/or an RU) may communicate with a second WCD 610 (e.g., a UE 120, a network node 110, a CU, a DU, and/or an RU). In some aspects, the first WCD 605 and the second WCD 610 may be part of a wireless network (e.g., the wireless network 100). In some aspects, the first WCD 605 and the second WCD 610 may have established a wireless connection prior to operations shown in FIG. 6. In some aspects, the first WCD 605 and the second WCD 610 may communicate via a fronthaul link or a midhaul link. In other aspects, the first WCD 605 and the second WCD 610 may communicate via an RF access link.

In some aspects, actions described herein as being performed by a WCD or a network node 110 may be performed by multiple different network nodes. For example, configuration actions may be performed by a first network node (for example, a CU or a DU), and radio communication actions may be performed by a second network node (for example, a DU or an RU). As used herein, a WCD "transmitting" a communication to another WCD may refer to a direct transmission (for example, from the WCD to the other WCD) or an indirect transmission via one or more other network nodes or devices. For example, if the first WCD 605 is a DU and the second WCD 610 is a UE 120, an indirect transmission to the UE 120 may include the DU transmitting a communication to an RU and the RU transmitting the communication to the UE 120.

In some aspects, as shown by reference number 615, the first WCD 605 may transmit, and the second WCD 610 may receive, configuration information. In other aspects, both the first WCD 605 and the second WCD 610 may receive the configuration information from another device not shown in FIG. 6, such as a control entity (e.g., a CU, a DU, or a base station). In some aspects, the first WCD 605 and/or the second WCD 610 may receive the configuration information via one or more of RRC signaling, one or more MAC control elements (MAC-CEs), and/or downlink control information (DCI), among other examples. In some aspects, the configuration information may include an indication of one or more configuration parameters for selection by the first WCD 605 and/or the second WCD 610, and/or explicit configuration information, among other examples.

In some aspects, the configuration information may indicate that the first WCD 605 and/or the second WCD 610 is to perform error-correcting coding on samples (e.g., complex samples or real samples) of data to be communicated between the first WCD 605 and the second WCD 610. For example, the configuration information may indicate that the first WCD 605 and/or the second WCD 610 is to encode real samples or complex samples (e.g., I/Q samples, LLRs, and/or constellation symbols) of data to obtain encoded data based at least in part on adding one or more time domain complex samples to the real samples or the complex samples of the data. In some aspects, the configuration information may indicate that a function of the one or more time domain complex samples (e.g., that are added to encode the complex samples of the data) is to be a known value. In some aspects, the configuration information may indicate that known value. For example, the known value may be zero or another value that is configured. In some aspects, the configuration information may indicate that the function is a sum of exponentials of the one or more time domain complex samples. For example, the function may be a discrete Fourier transform (DFT) of the one or more time domain complex samples or another function of the of the one or more time domain complex samples.

In some aspects, the configuration information may indicate that the one or more time domain complex samples (e.g., that are added to encode the complex samples of the data) are to be scaled. For example, the configuration information may indicate that the first WCD 605 and/or the second WCD 610 is to apply a scaling factor to the one or more time domain complex samples. In some aspects, the configuration information may indicate the scaling factor. In some aspects, the configuration information may indicate that the scaling factor is based at least in part on a quantity of complex samples associated with data to be transmitted (e.g., where the quantity of complex samples includes the added time domain complex sample(s)). For example, if the quantity of complex samples associated with data is N, then the configuration information may indicate that the scaling factor is 1/N. Applying the scaling factor to the one or more time domain complex samples (e.g., that are added to encode the complex samples of the data) may improve a peak-to-average-power-ratio (PAPR) of a signal associated with the encoded complex samples of the data. In some aspects, an encoder (e.g., the first WCD 605 and/or the second WCD 610) may scale the one or more time domain complex samples (e.g., that are added to encode the complex samples of the data) before adding the one or more time domain complex samples to complex sample(s) of data. Alternatively, the encoder may scale the one or more time domain complex samples after adding the one or more time domain complex samples to complex sample(s) of data.

In some aspects, the configuration information may indicate that the first WCD 605 and/or the second WCD 610 is to perform FEC coding on digital samples (e.g., bit samples) after encoding the complex samples of the data. For example, the configuration information may indicate that the first WCD 605 and/or the second WCD 610 is to perform LDPC coding or Reed-Solomon coding, among other examples, on digital samples (e.g., bit samples) after encoding the complex samples of the data. In this way, the sample-level coding described herein may be referred to as an "outer code" or "outer coding" that is performed on the complex samples or real samples of data before (e.g., in an encoding operation) or after (e.g., in a decoding operation) FEC coding is performed on digital samples (e.g., bit samples) of the data. In other words, the configuration information may indicate that the first WCD 605 and/or the second WCD 610 is to encode, using an error-correcting code (e.g., a FEC code), a binary representation of the real samples or complex samples of the data and the one or more (added) time domain complex samples to obtain encoded data.

In some aspects, the configuration information may indicate that the first WCD 605 and/or the second WCD 610 is to decode encoded data to obtain complex data samples based at least in part on determining complex noise samples using a subset of complex samples, from the set of complex samples, that have a function equal to a known value, and removing the complex noise samples from the set of complex samples to obtain the complex data samples. For example, the subset of complex samples may correspond to the one or more time domain complex samples (e.g., that are added to encode the complex samples of the data). Because a function of the one or more time domain complex samples is equal to the known value, the first WCD 605 and/or the second WCD 610 may determine complex noise samples (e.g., errors or noise introduced to the complex samples of the data) using the known value and the received subset of complex samples that correspond to the one or more time domain complex samples. For example, the first WCD 605 and/or the second WCD 610 may use a curve fitting model (e.g., a Prony algorithm or another technique) to determine a function of the errors or noise introduced to the complex samples of the data, as described in more detail elsewhere herein.

In some aspects, the configuration information may indicate one or more conditions for performing the complex sample-level coding described herein. For example, a condition may be associated with the curve fitting model (e.g., the Prony algorithm or another technique) that is used to determine a function of the errors or noise introduced to the complex samples of the data. In some aspects, the condition may be associated with a quantity of the complex noise samples being less than or equal to half of a quantity of the subset of complex samples (e.g., less than half of the quantity of complex samples added by an encoder). In other words, the condition may be associated with a quantity of complex samples that are effected by noise or other errors being less than half of the quantity of complex samples added by an encoder. In some aspects, decoding may be performed in response to the quantity of the complex noise samples being less than or equal to half of a quantity of the subset of complex samples.

The first WCD 605 and/or the second WCD 610 may configure itself based at least in part on the configuration information. In some aspects, the first WCD 605 and/or the second WCD 610 may be configured to perform one or more operations described herein based at least in part on the configuration information.

In some aspects, as shown by reference number 620, the second WCD 610 may transmit, and the first WCD 605 may receive, a capability report. In some aspects, the capability report may indicate that the second WCD 610 supports sample-level (e.g., complex sample-level) coding, as described herein. Additionally, or alternatively, the first WCD 605 may transmit, and the second WCD 610 may receive, a capability report indicating that the first WCD 605 supports sample-level (e.g., complex sample-level) coding, as described herein. Additionally, or alternatively, the first WCD 605 and/or the second WCD 610 may transmit a capability report (e.g., indicating support for complex sample-level coding) to a control entity not shown in FIG. 6 (e.g., a CU, a DU, or a base station). The first WCD 605 and/or the second WCD 610 may perform complex sample-level coding, as described herein, based at least in part on both the first WCD 605 and/or the second WCD 610 indicating support for the complex sample-level coding.

As shown by reference number 625, the first WCD 605 may obtain complex samples or real samples of data that are to be transmitted to the second WCD 610. For example, the first WCD 605 may receive the complex samples from a UE 120 or another WCD. As an example, a UE 120 may transmit, and the first WCD 605 may receive, modulated information bits (e.g., complex samples) of data over an RF access link (e.g., when the first WCD 605 is an RU). As another example, the first WCD 605 may obtain the complex samples or real samples of data based at least in part on modulating uplink information bits of the data (e.g., when the first WCD 605 is a UE 120) or downlink information bits of the data (e.g., when the first WCD 605 is a DU). As another example, the first WCD 605 may obtain the complex samples or real samples of data from another device such as a CU (e.g., when the first WCD 605 is a DU). As another example, the first WCD 605 may generate the complex samples or the real samples of the data.

As shown by reference number 630, the first WCD 605 may encode the complex samples of the data (e.g., may encode complex data samples to be transmitted to the second WCD 610). For example, the first WCD 605 may encode the complex samples of the data directly without going through a binary representation of the complex samples (e.g., without converting the complex samples to a binary representation). For example, the first WCD 605 may encode the real samples of the data (e.g., the complex samples) by adding one or more time domain complex samples to the real samples of the data. For example, the first WCD 605 may obtain the complex samples or the real samples of the data. The first WCD 605 may add the one or more time domain complex samples by appending or inserting the one or more time domain complex samples to the obtained complex samples or the real samples of the data to generate a set of complex samples to be transmitted to the second WCD 605 (e.g., the set of complex samples including the complex samples or the real samples of the data and the one or more time domain complex samples). For example, in some cases, multiple time domain complex samples may be appended to, or added to, multiple complex samples of the data. As another example, a single time domain complex sample may be appended to, or added to, multiple complex samples of the data. As another example, a single time domain complex sample may be appended to, or added to, a single complex sample of the data.

A function (e.g., a sum of exponentials of the one or more time domain complex samples) of the of the one or more time domain complex samples may be a known value. In some aspects, the known value may be defined, or otherwise fixed, by a wireless communication standard, such as the 3 GPP (e.g., and stored in a memory of the first WCD 605 and the second WCD 610). As another example, the first WCD 605 may transmit, and the second WCD 610 may receive, an indication of the known value. As another example, the first WCD 605 and the second WCD 610 may receive indication(s) of the known value (e.g., from a control entity, such as a CU). For example, a frequency domain representation (e.g., a DFT) of the one or more time domain complex samples may be the known value. In some aspects, the known value may be zero or another value. In other words, one or more complex samples may be added to the real samples of the data, where a function of the added complex sample(s) is nulled or set to another value.

For example, the first WCD 605 may obtain K complex samples (e.g., as described above in connection with reference number 625). The first WCD 605 may add or append K−N complex samples to the K complex samples to obtain N (encoded) complex samples. In some aspects, a value of K−N may be configured (e.g., in the configuration information as described above). In other aspects, a value of K−N may be based at least in part on a value of K. For example, a value of K−N may be based at least in part on a desired or configured code rate for the outer coding applied by the first WCD 605. For example, the code rate for the outer coding may be K/N.

The added time domain complex samples (e.g., the added K−N complex samples) may be added to an end or a start of the real samples of the data. In other words, the added K−N complex samples may be a postfix (e.g., added to an end of the real samples of the data) or a prefix (e.g., added to a start of the real samples of the data). In other aspects, the added time domain complex samples (e.g., the added K−N complex samples) may be added to another location within the real samples of the data (e.g., that is configured or negotiated between the first WCD 605 and the second WCD 610).

For example, an input of the K complex samples may be x. The first WCD 605 may encode the input x by adding an N-K length postfix (or prefix) to the input x. As an example, the encoded N complex samples may be $\tilde{x}$, where $\tilde{x}_i = x_i$ for $i=1, \ldots, K$, and $\tilde{X}=f(\tilde{x})_i=M$ for $i=K+1, \ldots, N$ where $f(\ )$ is the function (e.g., a sum of exponentials and/or a DFT) and M is the known value (e.g., zero or another value). In some aspects, the N-K complex samples may be redundant complex samples or parity complex samples of the data. For example, the N-K complex samples may be the same as one or more of the K complex samples, may be a redundancy version of one or more of the K complex samples, and/or a combination of one or more of the K complex samples, among other examples. For example, the first WCD 605 may determine or compute the N-K complex samples based at least in part on the K complex samples (e.g., using the K complex samples) and to cause the function of the N-K complex samples to be equal to the known value, as described above. In other aspects, the first WCD 605 may determine or compute the N-K complex samples without using the K complex samples (e.g., may determine or compute the N-K complex samples to cause the function of the N-K complex samples to be equal to the known value, as described above).

In some aspects, the first WCD 605 may perform compression of the K complex samples. For example, the first WCD 605 may perform compression of the K complex samples to reduce the size of the K complex samples. For example, the first WCD 605 may perform compression of I/Q samples (e.g., the K complex samples) to be transmitted by the first WCD 605. In some aspects, the first WCD 605 may perform header compression to remove a header from a packet that includes one or more of the K complex samples and attach a compression sub-header that includes a context identifier. In some aspects, the first WCD 605 may perform uplink data compression (UDC) or another type of data compression to reduce the size of the packet. The first WCD 605 may perform the compression based at least in part on a compression protocol or compression technique, such as robust header compression (RoHC), Ethernet header compression (EHC), and/or UDC, among other examples.

In some aspects, the first WCD 605 may perform compression of the K complex samples before adding the N-K complex samples. For example, the first WCD 605 may compress the real samples (e.g., the K complex samples) to obtain compressed real samples. As used herein, real samples and complex samples may be used interchangeably. The first WCD 605 may add the one or more time domain complex samples (e.g., the N-K complex samples) to the compressed real samples. In some other aspects, the first WCD 605 may perform compression of the complex samples after adding the N-K complex samples. For example, the first WCD 605 may add the one or more time domain complex samples to the real samples to obtain the encoded data (e.g., the N complex samples). The first WCD 605 may compress the encoded data (e.g., the N complex samples) after adding the one or more time domain complex samples (e.g., after adding the N-K complex samples to the K complex samples).

In some aspects, the first WCD 605 may scale the N-K complex samples (e.g., may scale values of the N-K complex samples). For example, the one or more time domain complex samples added by the first WCD 605 may be scaled time domain complex samples. In some aspects, the first WCD 605 may apply a scaling factor to the N-K complex samples (e.g., to the one or more time domain complex samples). For example, after calculating or determining the N-K complex samples (e.g., to the one or more time domain complex samples), the first WCD 605 may apply the scaling factor to reduce a size of the values of the N-K complex samples. This may improve a PAPR of a signal associated with the data because of the reduced size of the values of the N-K complex samples. In some aspects, the scaling factor may be based at least in part on a quantity of complex samples to be transmitted by the first WCD 605. For example, the scaling factor may be 1/N.

In some aspects, as shown by reference number 635, the first WCD 605 may encode digital (e.g., bit) samples of the complex data samples (e.g., of the N complex samples). For example, the first WCD 605 may convert the N complex samples to a binary representation (e.g., convert the N complex samples to one or more digital samples). The first WCD 605 may perform FEC encoding on the one or more digital samples. In other words, encoding the data may include encoding, using an error-correcting code and/or an FEC code, a binary representation of the real samples (e.g., the K complex samples) and the one or more time domain complex samples (e.g., the N-K complex samples) to obtain encoded data (e.g., encoded bits or encoded packets).

For example, the first WCD 605 may apply an FEC encoding algorithm, such as an LDPC encoding algorithm or a Reed-Solomon encoding algorithm, to encode a data stream (e.g., of digital samples) with redundant information and/or error correction information such that the second WCD 610 (e.g., applying a complementary FEC decoding algorithm) may correct for recovery errors to bits or digital samples that are based at least in part on a distortion in a received signal. In some aspects, the FEC coding applied to the digital samples may include any type of network coding scheme, such as LDPC coding, Reed-Solomon coding, fountain coding, linear coding, random linear coding, Luby transform (LT) coding, and/or Raptor coding, among other examples.

As shown by reference number 640, the first WCD 605 may transmit, and the second WCD 610 may receive, the encoded data (e.g., encoded bits). For example, the first WCD 605 may transmit, and the second WCD 610 may receive, a signal that is based at least in part on digital samples of the data (e.g., as described above in connection with FIG. 4). In some aspects, the first WCD 605 may transmit, and the second WCD 610 may receive, the encoded data via a fronthaul link or a midhaul link. In other aspects, the first WCD 605 may transmit, and the second WCD 610 may receive, the encoded data via an RF access link.

In some aspects, as shown by reference number 645, the second WCD 610 may decode digital samples of the encoded data (e.g., if the first WCD 605 applies a FEC code to the digital samples as described in more detail elsewhere herein, such as in connection with reference number 635). For example, the second WCD 610 may decode, using an error-correcting code, a binary representation of the encoded data to obtain a set of complex samples. For example, the second WCD 610 may apply an FEC decoding technique or algorithm to decode the binary representation of the encoded data to obtain digital samples of the encoded data. The second WCD 610 may convert the digital samples to complex samples to obtain a set of complex samples that are received from the first WCD 605. In other words, the second WCD 610 may obtain a set of N complex samples that are received from the first WCD 605.

As described elsewhere herein, the set of N complex samples that are received by the second WCD 610 may be different than the N complex samples that are transmitted by the first WCD 605. For example, noise over a channel via which the signal is transmitted may introduce errors into one or more of the N complex samples. Additionally, or alternatively, errors may be introduced via hardware components used to compute the samples and/or used to transmit or receive the signal. For example, errors to the N complex samples may be introduced due to problems with one or more hardware components of the first WCD 605 and/or one or more hardware components of the second WCD 610. As a result, the N complex samples that are received by the second WCD 610 may be different than the N complex samples that are transmitted by the first WCD 605 (e.g., even after applying the FEC coding to the digital samples of the data).

As shown by reference number 650, the second WCD 610 may decode the complex data samples (e.g., the N complex samples that are received by the second WCD 610) to determine complex noise samples. The complex noise samples may represent the errors introduced to the N complex samples that are received by the second WCD 610 (e.g., via the channel, hardware component(s) of the first WCD 605, and/or hardware component(s) of the second WCD 610). For example, the second WCD 610 may decode the complex data samples using a subset of complex samples, from the set of complex samples, that have a function equal to a known value (e.g., using the N-K complex samples added at the encoding operation performed by the first WCD 605).

In some aspects, decoding the encoded data may be based at least in part on a quantity of the complex noise samples being less than or equal to half of a quantity of the subset of complex samples. For example, for the decoding to effectively determine the complex noise samples, a quantity of the complex noise samples may be less than or equal to $$\frac{N-K}{2}.$$

If the quantity of the complex noise samples is greater than the quantity of the subset of complex samples, then the second WCD 610 may refrain from performing the complex sample-level decoding operation.

For example, the second WCD 610 may determine or compute the N-K complex samples (e.g., the subset of complex samples) from the set of N complex samples received by the second WCD 610. For example, the second WCD 610 may compute and/or determine a postfix (or prefix) of N-DFT of the samples received from the first WCD 605 to obtain the N-K complex samples. For example, the set of N complex samples received by the second WCD 610 may be represented by y. The second WCD 610 may determine $y_{(K+1, \ldots, N)}$ to obtain the N-K complex samples that were added by the first WCD 605 (e.g., that have the function equal to the known value when added by the first WCD 605). For example, the second WCD 610 may identify the subset of complex samples from an end or a start of the set of complex samples received by the second WCD 610.

In some aspects, the second WCD 610 may apply a scaling factor to the N-K complex samples (e.g., the subset of complex samples). For example, if the first WCD 605 scales the N-K complex samples during encoding, then the second WCD 610 may scale the N-K complex samples prior to decoding the N complex samples. For example, the second WCD 610 may apply an inverse of the scaling factor applied by the first WCD 605.

In some aspects, the second WCD 610 may decode the set of complex values before decompressing the complex values (e.g., before performing I/Q decompression). For example, the second WCD 610 may decompress the complex data samples after decoding the encoded data. In other aspects, the second WCD 610 may decode the set of complex values after decompressing the complex values (e.g., after performing FQ decompression). For example, the second WCD 610 may decode set of complex samples after decompressing the set of complex samples. For example, the second WCD 610 may perform the decoding operation described herein before or after performing I/Q decompression based at least in part on an order of the encoding performed by the first WCD 605 with respect to the FQ compression performed by the first WCD 605. For example, if the first WCD 605 encoded the complex samples prior to performing I/Q compression, then the second WCD 610 may decode the complex samples prior to performing I/Q decompression. Alternatively, if the first WCD 605 encoded the complex samples after performing I/Q compression, then the second WCD 610 may decode the complex samples after performing FQ decompression.

As shown by reference number 655, the second WCD 610 may determine the noise complex sample(s) using the N-K complex samples received by the second WCD 610. For example, the subset of complex samples (e.g., the N-K complex samples) and the known value into a curve fitting model. An output of the curve fitting model may be the complex noise sample(s). For example, the curve fitting model may be a Prony model (e.g., a Prony algorithm or Prony analysis) or another curve fitting model. For example, Prony analysis may approximate a sequence of equally spaced samples to a linear combination of complex exponential functions with differing amplitudes, damping factors, frequencies and phase angles. Prony analysis may include using an autoregressive model of order p that assumes that the value of sampled data x(n) depends linearly on the preceding p values in x. Solving the linear system of equations obtains coefficients of the characteristic or Prony polynomial φ(z). The roots of the polynomial yield two of the parameters of the solution (damping factors and frequency) and provide a second system of equations to calculate the amplitude and phase of the p functions. As a result, a curve of p exponential terms to a dataset of 2p elements.

In other words, given an unknown function ƒ(x) composed of n complex exponentials, then ƒ(x) can be specified via (at least) 2n equally-spaced samples of ƒ(x). For example, the complex noise samples may be n unknown locations and n unknown values. Therefore, by using the N-K complex samples as an input to the Prony analysis, the second WCD 610 may determine a curve fitting the N complex samples. By intentionally setting the function of the N-K complex samples to the known value at the encoding operation, a function of the complex noise sample(s) may be determined from the ƒ(x) that is output by the Prony analysis (e.g., where ƒ(x) is a function composed of a set of complex exponentials). For example, using the N-K complex samples, the function of the complex noise samples may be determined based at least in part on a difference between the ƒ(x) that is output by the Prony analysis and the known value. For example, when the known value is zero, the function of the function of the complex noise samples may be the ƒ(x) that is output by the Prony analysis. For example, the second WCD 610 may identify the complex noise samples based on a difference between the known value and received information associated with the subset of complex samples (e.g., a difference between the function output by the curve fitting model).

As shown by reference number 660, the second WCD 610 may remove the complex noise samples from the set of complex samples received by the second WCD 610 to obtain the complex data samples that were encoded by the first WCD 605. For example, the second WCD 610 may identify complex samples, from the set of complex samples, that have errors. For example, the output of the curve fitting model may indicate a sample and a complex value associated with noise and/or other errors. The second WCD 610 may modify the complex sample (as received by the second WCD 610) by removing the complex value associated with noise and/or other errors. In this way, the second WCD 610 may be enabled to recover the exact N complex samples that were transmitted by the first WCD 605 (e.g., so long as all conditions associated with performing the complex sample-level coding are met, as described above). In some aspects, the second WCD 610 may remove the subset of complex samples (e.g., the N-K complex samples) from the N complex samples received by the second WCD 610 to obtain the K complex samples originally encoded by the first WCD 605.

As a result, the second WCD 610 may be enabled to correct errors introduced to complex samples of data transmitted via a channel (e.g., a fronthaul link). For example, the second WCD 610 may be enabled to determine errors introduced to the complex samples of data (e.g., to determine the complex noise samples) using a subset of complex samples that have a function that is equal to a known value (e.g., exponentials of one or more time domain complex samples that sum to the known value). For example, a difference in a function of the received subset of complex samples from the known value may indicate the complex noise samples to be removed from the received complex samples. Reducing errors to the complex samples of data transmitted via a channel may improve a performance, and/or reliability, among other examples, of communications via the channel. Additionally, reducing errors to the complex samples may result in less retransmissions via the channel. Reducing a quantity of retransmissions may reduce latency associated with communications via the channel.

As indicated above, FIG. 6 is provided as an example. Other examples may differ from what is described with respect to FIG. 6.

Figure 7:
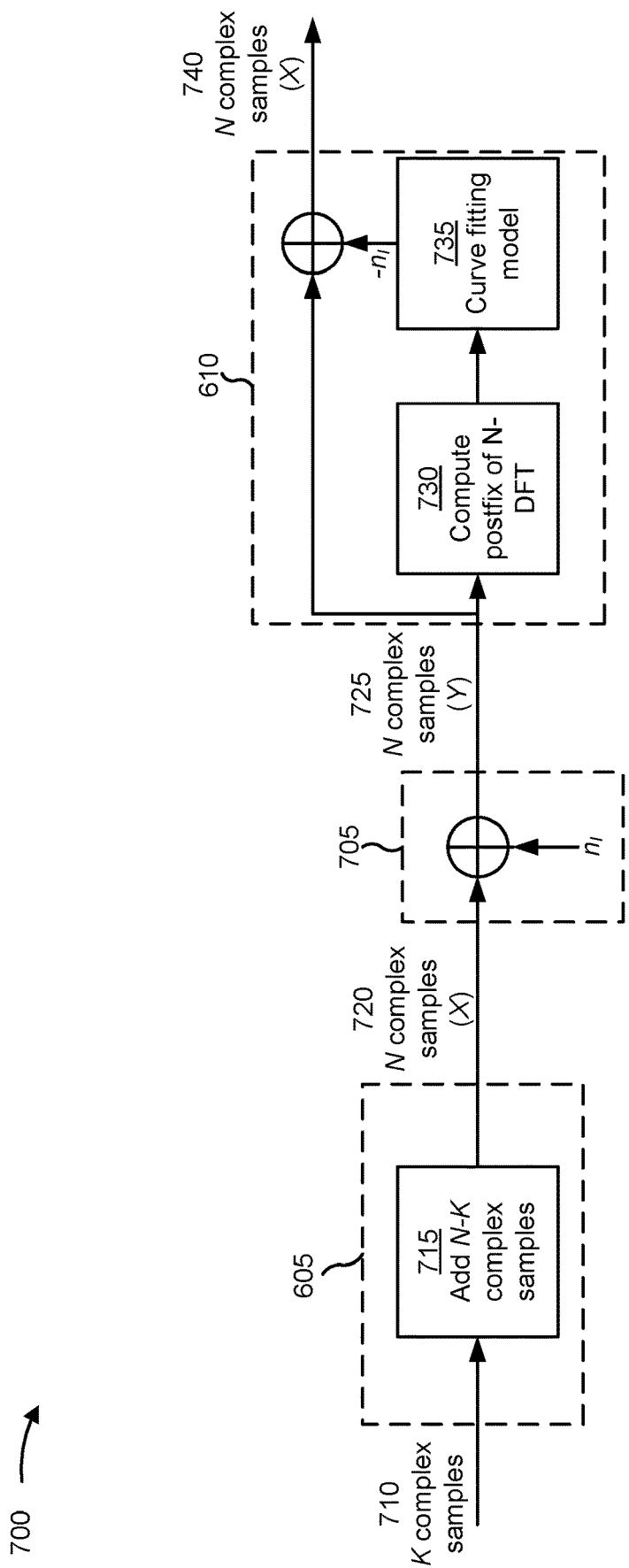
FIG. 7 is a diagram of an example associated with sample-level error-correcting code, in accordance with the present disclosure.

FIG. 7 is a diagram of an example 700 associated with sample-level error-correcting code, in accordance with the present disclosure. As shown in FIG. 7, the first WCD 605 may communicate with the second WCD 610 via a channel 705. For example, the channel 705 may be associated with a fronthaul link, a midhaul link, and/or an RF access link, among other examples.

The first WCD 605 may obtain K complex samples 710. As described in more detail elsewhere herein, the K complex samples 710 may be FQ samples, constellation symbols, and/or LLRs, among other examples. As an example, K may be equal to 6 (e.g., for 6 64 QAM constellation symbols). For example, the K complex samples 710 may be [−3 7 −7 −5 1 3]+j*[7 3 −3 7 7 3]. As shown by reference number 715, the first WCD 605 may add N-K complex samples to the K complex samples to obtain N complex samples. As an example, N may be 8. Therefore, the first WCD 605 may add 2 time domain complex samples (e.g., parity samples) that have a function equal to a known value (e.g., a sum of exponentials and/or a DFT equal to the known value). For example, the N-K complex samples may be [−42.46 −6.31]+j*[38.31 −48.46] (e.g., having a DFT equal to zero). In some aspects, the first WCD 605 may scale the N-K complex samples by a scaling factor. For example, the scaling factor may be 1/N (e.g., ⅛ in the example described above). For example, the N-K complex samples added by the first WCD 605 may be [−5.30 −0.79]+j*[4.79 −6.06]. For example, the first WCD 605 may encode the K complex samples 710 to obtain N complex samples 720 of x=[−3 7 −7 −5 1 3 −5.30 −0.79]+*[7 3 −3 7 7 3 4.79 −6.06].

The first WCD 605 may transmit the N complex samples 720 via the channel 705. As shown in FIG. 7, in may be introduced via the channel and/or during transmission or reception of the N complex samples 720. $n_f$ may be an error associated with the N complex samples 720. For example, $n_f(3)$ may be 2 +2j (e.g., may be an error introduced to the third complex sample of the N complex samples 720). For example, the second WCD 610 may receive N complex samples 725 of y. As a result of the $n_f(3)$, the second WCD 610 may receive the y(3)=−5−1j (e.g., instead of −7−3j).

In some aspects, the second WCD 610 may extract the N-K samples from the N complex samples 725 of y. In some aspects, the second WCD 610 may scale the N-K samples (e.g., by N if the first WCD 605 scaled the N-K complex samples by 1/N). As shown by reference number 730, the second WCD 610 may determine a postfix of an N-DFT of the N complex samples 725. For example, the second WCD 610 may extract N-K complex samples from an N-DFT of the N complex samples 725. For example, the N-K complex samples from the N-DFT of the N complex samples 725 may be [−2 −2]+j*[−2 2].

As shown by reference number 735, the second WCD 610 may apply a curve fitting model (e.g., a Prony algorithm) to the N-K complex samples from the N-DFT of the N complex samples 725 to determine a function (e.g., a DFT) of the noise introduced to the N complex samples 720. For example, the curve fitting model (e.g., a Prony algorithm) may output that the $n_f(3)$ is 2 +2j. For example, because two samples (e.g., N-K) are input to the curve fitting model, the model may be capable of identifying one error in the received sequence $$\left(\text{e.g., } \frac{N-K}{2} = 1 \text{ in this example}\right).$$

Therefore, curve fitting model may output an identifier of the sample (e.g., 3) and the function of the noise (e.g., 2 +2j). Therefore, the second WCD 610 may determine that $-n_f(3) = -2 -2j$.

The second WCD 610 may obtain N complex samples 740 by combining $-n_f(3)$ with the N complex samples 725. The N complex samples 740 may be equal to the N complex samples 720 because then $n_f$ was removed from the N complex samples 725 that were received by the second WCD 610, as described above. The second WCD 610 may remove the N-K complex samples from the N complex samples 740 to obtain the K complex samples 710 that were encoded by the first WCD 605.

This may improve a performance of communications via the channel 705. For example, this may improve a performance and/or reliability of a link between a UE 120 and a DU, where the link includes a fronthaul link (e.g., the channel 705) that uses complex samples as data inputs. For example, the outer coding (e.g., the complex sample-level coding) described herein may enable wireless communication devices to correct errors that occur over a fronthaul link, thereby improving a performance and/or reliability of an end-to-end link for a UE 120.

As indicated above, FIG. 7 is provided as an example. Other examples may differ from what is described with respect to FIG. 7.

FIG. 8 is a diagram illustrating an example process 800 performed, for example, by a first wireless communication device, in accordance with the present disclosure. Example process 800 is an example where the first wireless communication device (e.g., the first WCD 605, a network node 110, a DU, an RU, and/or a UE 120) performs operations associated with sample-level error-correcting code.

As shown in FIG. 8, in some aspects, process 800 may include encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples (block 810). For example, the first wireless communication device (e.g., using communication manager 1008 and/or encoding component 1010, depicted in FIG. 10) may encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples, as described above.

As further shown in FIG. 8, in some aspects, process 800 may include transmitting, to a second wireless communication device, the encoded data (block 820). For example, the first wireless communication device (e.g., using communication manager 1008 and/or transmission component 1004, depicted in FIG. 10) may transmit, to a second wireless communication device, the encoded data, as described above.

Process 800 may include additional aspects, such as any single aspect or any combination of aspects described below and/or in connection with one or more other processes described elsewhere herein.

In a first aspect, the function may be a DFT of the one or more time domain complex samples.

In a second aspect, alone or in combination with the first aspect, encoding the complex samples may comprise adding the one or more time domain complex samples to an end or a start of the complex samples of the data.

In a third aspect, alone or in combination with one or more of the first and second aspects, the one or more time domain complex samples may be redundant samples or parity samples of the data.

In a fourth aspect, alone or in combination with one or more of the first through third aspects, encoding the complex samples may include adding the one or more time domain complex samples to the complex samples to obtain the encoded data, and may comprise compressing the encoded data after adding the one or more time domain complex samples.

In a fifth aspect, alone or in combination with one or more of the first through fourth aspects, encoding the complex samples may include compressing the complex samples to obtain compressed complex samples, and may comprise adding the one or more time domain complex samples to the compressed complex samples.

In a sixth aspect, alone or in combination with one or more of the first through fifth aspects, the known value may be zero.

In a seventh aspect, alone or in combination with one or more of the first through sixth aspects, the complex samples may include at least one of FQ samples, constellation symbols, or LLR values.

In an eighth aspect, alone or in combination with one or more of the first through seventh aspects, transmitting the encoded data may include transmitting the encoded data via a fronthaul link.

In a ninth aspect, alone or in combination with one or more of the first through eighth aspects, encoding the complex samples may include encoding, using an error-correcting code, a binary representation of the complex samples and the one or more time domain complex samples to obtain the encoded data.

In a tenth aspect, alone or in combination with one or more of the first through ninth aspects, the one or more time domain complex samples may be scaled time domain complex samples.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

FIG. 9 is a diagram illustrating an example process 900 performed, for example, by a first wireless communication device, in accordance with the present disclosure. Example process 900 is an example where the first wireless communication device (e.g., the second WCD 610, a network node 110, a DU, an RU, and/or a UE 120) performs operations associated with sample-level error-correcting code.

As shown in FIG. 9, in some aspects, process 900 may include receiving, from a second wireless communication device, encoded data including a set of complex samples (block 910). For example, the first wireless communication device (e.g., using communication manager 1108 and/or reception component 1102, depicted in FIG. 11) may receive, from a second wireless communication device, encoded data including a set of complex samples, as described above.

As further shown in FIG. 9, in some aspects, process 900 may include decoding the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples (block 920). For example, the first wireless communication device (e.g., using communication manager 1108 and/or decoding component 1110, depicted in FIG. 11) may decode the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples, as described above.

Process 900 may include additional aspects, such as any single aspect or any combination of aspects described below and/or in connection with one or more other processes described elsewhere herein.

In a first aspect, decoding the encoded data may be based at least in part on a quantity of the complex noise samples being less than or equal to half of a quantity of the subset of complex samples.

In a second aspect, alone or in combination with the first aspect, decoding the encoded data may comprise inputting the subset of complex samples and the known value into a curve fitting model, wherein an output of the curve fitting model may be the complex noise samples.

In a third aspect, alone or in combination with one or more of the first and second aspects, the curve fitting model may be a Prony model.

In a fourth aspect, alone or in combination with one or more of the first through third aspects, the function may be a DFT of the subset of complex samples.

In a fifth aspect, alone or in combination with one or more of the first through fourth aspects, decoding the encoded data may comprise identifying the complex noise samples based on a difference between the known value and received information associated with the subset of complex samples.

In a sixth aspect, alone or in combination with one or more of the first through fifth aspects, decoding the encoded data may comprise identifying the subset of complex samples from an end or a start of the set of complex samples.

In a seventh aspect, alone or in combination with one or more of the first through sixth aspects, the subset of complex samples may be redundant samples or parity samples of the encoded data.

In an eighth aspect, alone or in combination with one or more of the first through seventh aspects, decoding the encoded data may comprise decoding the encoded data to obtain the complex data samples, and may include decompressing the complex data samples after decoding the encoded data.

In a ninth aspect, alone or in combination with one or more of the first through eighth aspects, decoding the encoded data may include decompressing the set of complex samples, and may comprise decoding set of complex samples after decompressing the set of complex samples.

In a tenth aspect, alone or in combination with one or more of the first through ninth aspects, the known value may be zero.

In an eleventh aspect, alone or in combination with one or more of the first through tenth aspects, the set of complex samples may include at least one of I/Q samples, constellation symbols, or LLR values.

In a twelfth aspect, alone or in combination with one or more of the first through eleventh aspects, receiving the encoded data may include receiving the encoded data via a fronthaul link.

In a thirteenth aspect, alone or in combination with one or more of the first through twelfth aspects, decoding the encoded data may include decoding, using an error-correcting code, a binary representation of the encoded data to obtain the set of complex samples.

In a fourteenth aspect, alone or in combination with one or more of the first through thirteenth aspects, the subset of complex samples may be scaled samples.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
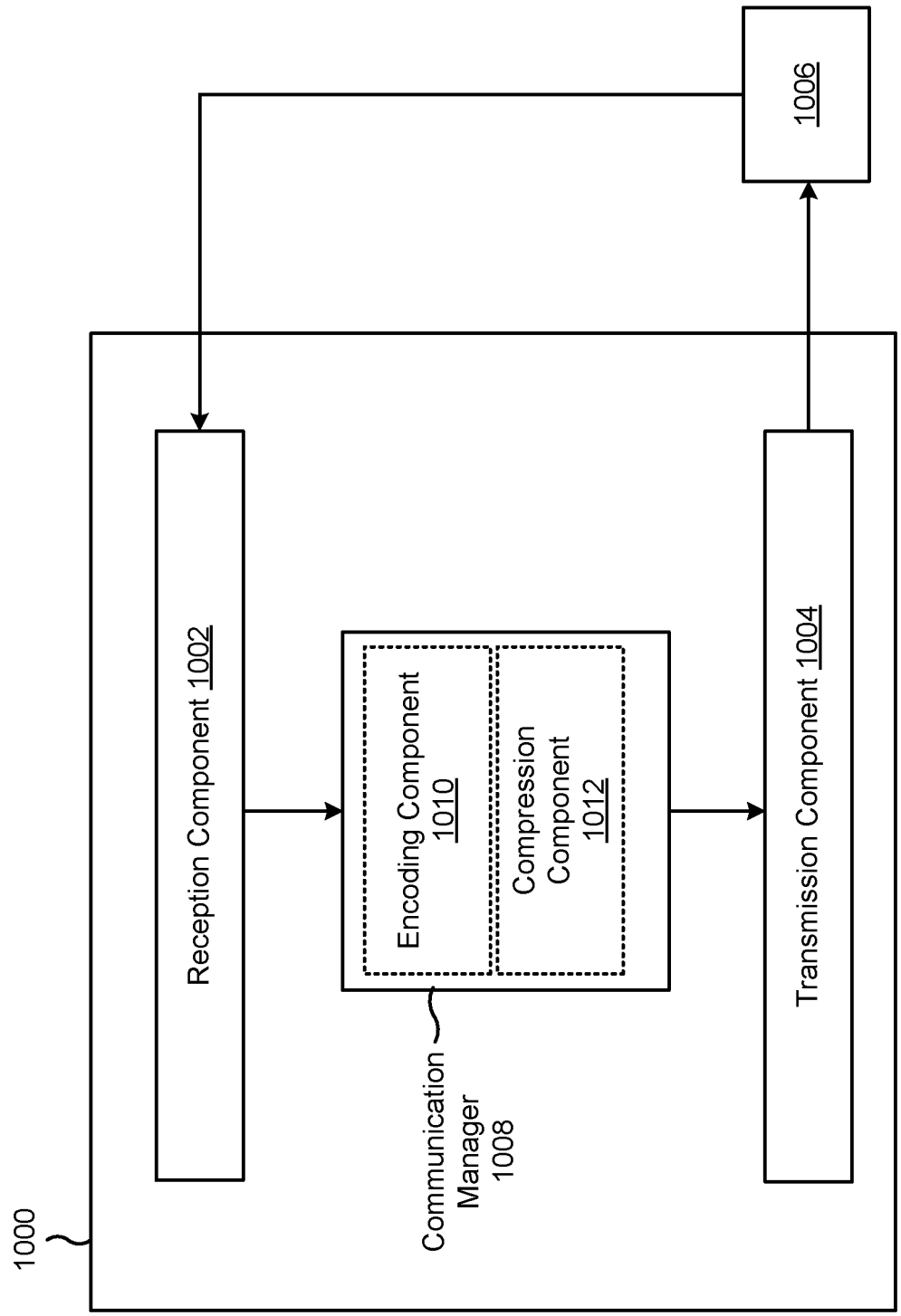
FIG. 10 is a diagram of an example apparatus for wireless communication, in accordance with the present disclosure.

FIG. 10 is a diagram of an example apparatus 1000 for wireless communication, in accordance with the present disclosure. The apparatus 1000 may be a wireless communication device, or a wireless communication device may include the apparatus 1000. In some aspects, the apparatus 1000 includes a reception component 1002 and a transmission component 1004, which may be in communication with one another (for example, via one or more buses and/or one or more other components). As shown, the apparatus 1000 may communicate with another apparatus 1006 (such as a UE, a base station, or another wireless communication device) using the reception component 1002 and the transmission component 1004. As further shown, the apparatus 1000 may include the communication manager 1008. In some aspects, the communication manager 1008 may be, or may include, the communication manager 140 and/or the communication manager 150. The communication manager 1008 may include one or more of an encoding component 1010, and/or a compression component 1012, among other examples.

In some aspects, the apparatus 1000 may be configured to perform one or more operations described herein in connection with FIGS. 6 and 7. Additionally, or alternatively, the apparatus 1000 may be configured to perform one or more processes described herein, such as process 800 of FIG. 8, or a combination thereof. In some aspects, the apparatus 1000 and/or one or more components shown in FIG. 10 may include one or more components of the wireless communication device described in connection with FIG. 2. Additionally, or alternatively, one or more components shown in FIG. 10 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1002 may receive communications, such as reference signals, control information, data communications, or a combination thereof, from the apparatus 1006. The reception component 1002 may provide received communications to one or more other components of the apparatus 1000. In some aspects, the reception component 1002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1000. In some aspects, the reception component 1002 may include one or more antennas, a modem, a demodulator, a MIMO detector, a receive processor, a controller/processor, a memory, or a combination thereof, of the network node and/or the UE described in connection with FIG. 2.

The transmission component 1004 may transmit communications, such as reference signals, control information, data communications, or a combination thereof, to the apparatus 1006. In some aspects, one or more other components of the apparatus 1000 may generate communications and may provide the generated communications to the transmission component 1004 for transmission to the apparatus 1006. In some aspects, the transmission component 1004 may perform signal processing on the generated communications (such as filtering, amplification, modulation, digital-to-analog conversion, multiplexing, interleaving, mapping, or encoding, among other examples), and may transmit the processed signals to the apparatus 1006. In some aspects, the transmission component 1004 may include one or more antennas, a modem, a modulator, a transmit MIMO processor, a transmit processor, a controller/processor, a memory, or a combination thereof, of the network node and/or the UE described in connection with FIG. 2. In some aspects, the transmission component 1004 may be co-located with the reception component 1002 in a transceiver.

The encoding component 1010 may encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples. The transmission component 1004 may transmit, to a second wireless communication device, the encoded data.

The encoding component 1010 may add the one or more time domain complex samples to an end or a start of the complex samples of the data.

The encoding component 1010 may add the one or more time domain complex samples to the complex samples to obtain the encoded data. A compression component 1012 may compress the encoded data after adding the one or more time domain complex samples.

The compression component 1012 may compress the complex samples to obtain compressed complex samples. The encoding component 1012 may add the one or more time domain complex samples to the compressed complex samples.

The transmission component 1004 may transmit the encoded data via a fronthaul link.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

Figure 11:
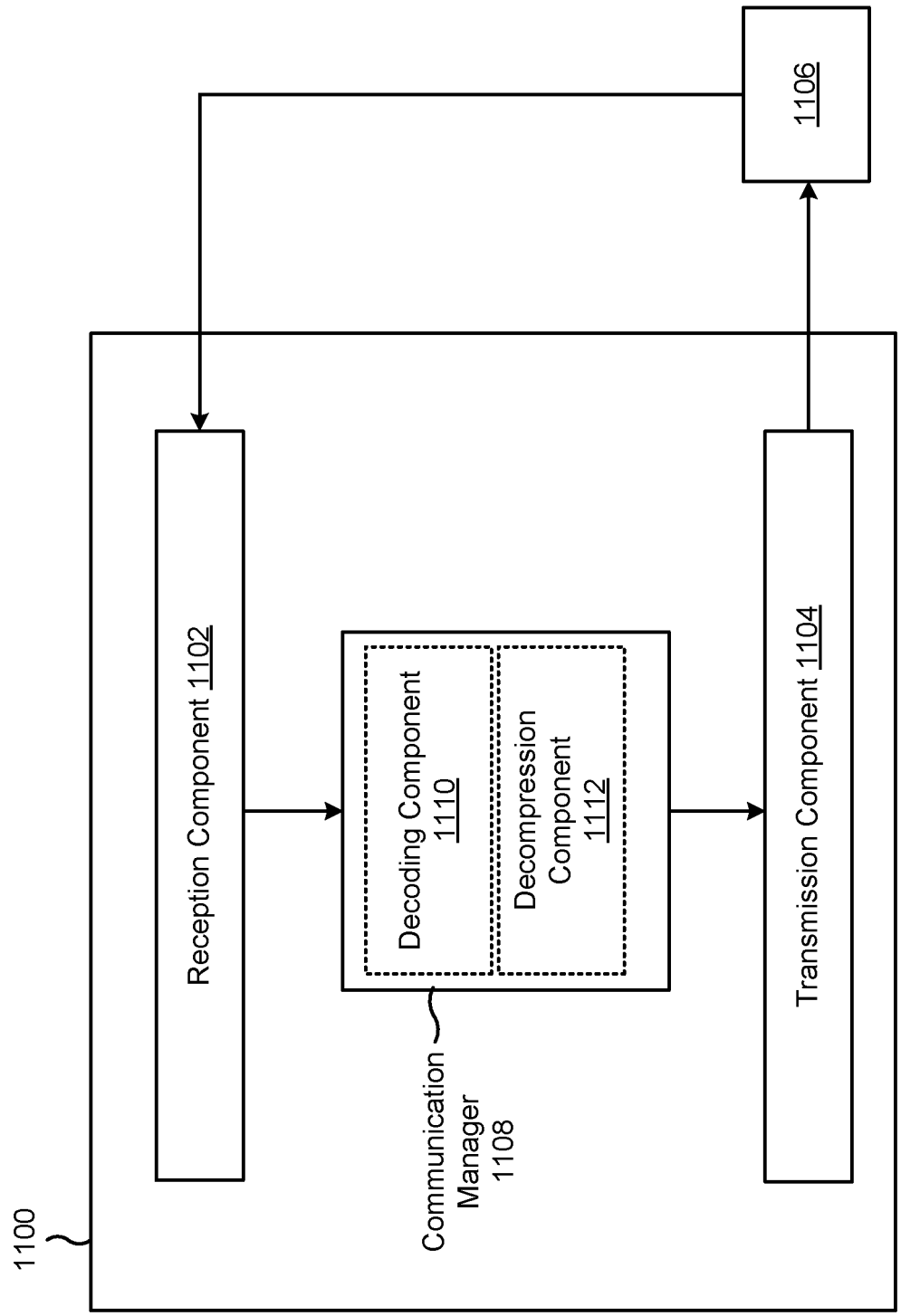
FIG. 11 is a diagram of an example apparatus for wireless communication, in accordance with the present disclosure.

FIG. 11 is a diagram of an example apparatus 1100 for wireless communication, in accordance with the present disclosure. The apparatus 1100 may be a wireless communication device, or a wireless communication device may include the apparatus 1100. In some aspects, the apparatus 1100 includes a reception component 1102 and a transmission component 1104, which may be in communication with one another (for example, via one or more buses and/or one or more other components). As shown, the apparatus 1100 may communicate with another apparatus 1106 (such as a UE, a base station, or another wireless communication device) using the reception component 1102 and the transmission component 1104. As further shown, the apparatus 1100 may include the communication manager 1108. In some aspects, the communication manager 1008 may be, or may include, the communication manager 140 and/or the communication manager 150. The communication manager 1108 may include one or more of a decoding component 1110, and/or a decompression component 1112, among other examples.

In some aspects, the apparatus 1100 may be configured to perform one or more operations described herein in connection with FIGS. 6 and 7. Additionally, or alternatively, the apparatus 1100 may be configured to perform one or more processes described herein, such as process 900 of FIG. 9, or a combination thereof. In some aspects, the apparatus 1100 and/or one or more components shown in FIG. 11 may include one or more components of the wireless communication device described in connection with FIG. 2. Additionally, or alternatively, one or more components shown in FIG. 11 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1102 may receive communications, such as reference signals, control information, data communications, or a combination thereof, from the apparatus 1106. The reception component 1102 may provide received communications to one or more other components of the apparatus 1100. In some aspects, the reception component 1102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1100. In some aspects, the reception component 1102 may include one or more antennas, a modem, a demodulator, a MIMO detector, a receive processor, a controller/processor, a memory, or a combination thereof, of the network node and/or the UE described in connection with FIG. 2.

The transmission component 1104 may transmit communications, such as reference signals, control information, data communications, or a combination thereof, to the apparatus 1106. In some aspects, one or more other components of the apparatus 1100 may generate communications and may provide the generated communications to the transmission component 1104 for transmission to the apparatus 1106. In some aspects, the transmission component 1104 may perform signal processing on the generated communications (such as filtering, amplification, modulation, digital-to-analog conversion, multiplexing, interleaving, mapping, or encoding, among other examples), and may transmit the processed signals to the apparatus 1106. In some aspects, the transmission component 1104 may include one or more antennas, a modem, a modulator, a transmit MIMO processor, a transmit processor, a controller/processor, a memory, or a combination thereof, of the network node and/or the UE described in connection with FIG. 2. In some aspects, the transmission component 1104 may be co-located with the reception component 1102 in a transceiver.

The reception component 1102 may receive, from a second wireless communication device, encoded data including a set of complex samples. The decoding component 1110 may decode the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

The decoding component 1110 may input the subset of complex samples and the known value into a curve fitting model, where an output of the curve fitting model is the complex noise samples.

The decoding component 1110 may identify the complex noise samples based on a difference between the known value and received information associated with the subset of complex samples. The decoding component 1110 may identify the subset of complex samples from an end or a start of the set of complex samples.

The decoding component 1110 may decode the encoded data to obtain the complex data samples. The decompression component 1112 may decompress the complex data samples after decoding the encoded data.

The decompression component 1112 may decompress the set of complex samples. The decoding component 1110 may decode set of complex samples after decompressing the set of complex samples.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

The following provides an overview of some Aspects of the present disclosure:

Aspect 1: A method of wireless communication performed by a first wireless communication device, comprising: encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and transmitting, to a second wireless communication device, the encoded data.

Aspect 2: The method of Aspect 1, wherein the function is a discrete Fourier transform (DFT) of the one or more time domain complex samples.

Aspect 3: The method of any of Aspects 1-2, wherein encoding the complex samples comprises: adding the one or more time domain complex samples to an end or a start of the complex samples of the data.

Aspect 4: The method of any of Aspects 1-3, wherein the one or more time domain complex samples are redundant samples or parity samples of the data.

Aspect 5: The method of any of Aspects 1-4, wherein encoding the complex samples comprises: adding the one or more time domain complex samples to the complex samples to obtain the encoded data; and compressing the encoded data after adding the one or more time domain complex samples.

Aspect 6: The method of any of Aspects 1-4, wherein encoding the complex samples comprises: compressing the complex samples to obtain compressed complex samples; and adding the one or more time domain complex samples to the compressed complex samples.

Aspect 7: The method of any of Aspects 1-6, wherein the known value is zero.

Aspect 8: The method of any of Aspects 1-7, wherein the complex samples include at least one of: in-phase/quadrature (I/Q) samples, constellation symbols, or log likelihood-ratio (LLR) values.

Aspect 9: The method of any of Aspects 1-8, wherein transmitting the encoded data comprises: transmitting the encoded data via a fronthaul link.

Aspect 10: The method of any of Aspects 1-9, wherein encoding the complex samples comprises: encoding, using an error-correcting code, a binary representation of the complex samples and the one or more time domain complex samples to obtain the encoded data.

Aspect 11: The method of any of Aspects 1-10, wherein the one or more time domain complex samples are scaled time domain complex samples.

Aspect 12: A method of wireless communication performed by a first wireless communication device, comprising: receiving, from a second wireless communication device, encoded data including a set of complex samples; and decoding the encoded data to obtain complex data samples based at least in part on determining complex noise samples using a subset of complex samples, from the set of complex samples, that have a function equal to a known value, and removing the complex noise samples from the set of complex samples to obtain the complex data samples, wherein the function is a sum of exponentials of the subset of complex samples.

Aspect 13: The method of Aspect 12, wherein decoding the encoded data is based at least in part on a quantity of the complex noise samples being less than or equal to half of a quantity of the subset of complex samples.

Aspect 14: The method of any of Aspects 12-13, wherein decoding the encoded data comprises: inputting the subset of complex samples and the known value into a curve fitting model, wherein an output of the curve fitting model is the complex noise samples.

Aspect 15: The method of Aspect 14, wherein the curve fitting model is a Prony model.

Aspect 16: The method of any of Aspects 12-15, wherein the function is a discrete Fourier transform (DFT) of the subset of complex samples.

Aspect 17: The method of any of Aspects 12-16, wherein decoding the encoded data comprises: identifying the complex noise samples based on a difference between the known value and received information associated with the subset of complex samples.

Aspect 18: The method of any of Aspects 12-17, wherein decoding the encoded data comprises: identifying the subset of complex samples from an end or a start of the set of complex samples.

Aspect 19: The method of any of Aspects 12-18, wherein the subset of complex samples are redundant samples or parity samples of the encoded data.

Aspect 20: The method of any of Aspects 12-19, wherein decoding the encoded data comprises: decoding the encoded data to obtain the complex data samples; and decompressing the complex data samples after decoding the encoded data.

Aspect 21: The method of any of Aspects 12-19, wherein decoding the encoded data comprises: decompressing the set of complex samples; and decoding the set of complex samples after decompressing the set of complex samples.

Aspect 22: The method of any of Aspects 12-21, wherein the known value is zero.

Aspect 23: The method of any of Aspects 12-22, wherein the set of complex samples include at least one of: in-phase/quadrature (I/Q) samples, constellation symbols, or log likelihood-ratio (LLR) values.

Aspect 24: The method of any of Aspects 12-23, wherein receiving the encoded data comprises: receiving the encoded data via a fronthaul link.

Aspect 25: The method of any of Aspects 12-24, wherein decoding the encoded data comprises: decoding, using an error-correcting code, a binary representation of the encoded data to obtain the set of complex samples.

Aspect 26: The method of any of Aspects 12-25, wherein the subset of complex samples are scaled samples.

Aspect 27: An apparatus for wireless communication at a device, comprising a processor; memory coupled with the processor; and instructions stored in the memory and executable by the processor to cause the apparatus to perform the method of one or more of Aspects 1-11.

Aspect 28: A device for wireless communication, comprising a memory and one or more processors coupled to the memory, the one or more processors configured to perform the method of one or more of Aspects 1-11.

Aspect 29: An apparatus for wireless communication, comprising at least one means for performing the method of one or more of Aspects 1-11.

Aspect 30: A non-transitory computer-readable medium storing code for wireless communication, the code comprising instructions executable by a processor to perform the method of one or more of Aspects 1-11.

Aspect 31: A non-transitory computer-readable medium storing a set of instructions for wireless communication, the set of instructions comprising one or more instructions that, when executed by one or more processors of a device, cause the device to perform the method of one or more of Aspects 1-11.

Aspect 32: An apparatus for wireless communication at a device, comprising a processor; memory coupled with the processor; and instructions stored in the memory and executable by the processor to cause the apparatus to perform the method of one or more of Aspects 12-26.

Aspect 33: A device for wireless communication, comprising a memory and one or more processors coupled to the memory, the one or more processors configured to perform the method of one or more of Aspects 12-26.

Aspect 34: An apparatus for wireless communication, comprising at least one means for performing the method of one or more of Aspects 12-26.

Aspect 35: A non-transitory computer-readable medium storing code for wireless communication, the code comprising instructions executable by a processor to perform the method of one or more of Aspects 12-26.

Aspect 36: A non-transitory computer-readable medium storing a set of instructions for wireless communication, the set of instructions comprising one or more instructions that, when executed by one or more processors of a device, cause the device to perform the method of one or more of Aspects 12-26.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A first wireless communication device for wireless communication, comprising:
a memory; and
one or more processors, coupled to the memory, configured to:
encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and
transmit, to a second wireless communication device, the encoded data.

2. The first wireless communication device of claim 1, wherein the function is a discrete Fourier transform (DFT) of the one or more time domain complex samples.

3. The first wireless communication device of claim 1, wherein the one or more processors, to encode the complex samples, are configured to:
add the one or more time domain complex samples to an end or a start of the complex samples of the data.

4. The first wireless communication device of claim 1, wherein the one or more time domain complex samples are redundant samples or parity samples of the data.

5. The first wireless communication device of claim 1, wherein the one or more processors, to encode the complex samples, are configured to:
add the one or more time domain complex samples to the complex samples to obtain the encoded data; and
compress the encoded data after adding the one or more time domain complex samples.

6. The first wireless communication device of claim 1, wherein the one or more processors, to encode the complex samples, are configured to:
compress the complex samples to obtain compressed complex samples; and
add the one or more time domain complex samples to the compressed complex samples.

7. The first wireless communication device of claim 1, wherein the known value is zero.

8. The first wireless communication device of claim 1, wherein the one or more processors, to transmit the encoded data, are configured to:
transmit the encoded data via a fronthaul link.

9. The first wireless communication device of claim 1, wherein the one or more processors, to encode the complex samples, are configured to:
scale the one or more time domain complex samples.

10. A method of wireless communication performed by a first wireless communication device, comprising:
encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and
transmitting, to a second wireless communication device, the encoded data.

11. The method of claim 10, wherein the function is a discrete Fourier transform (DFT) of the one or more time domain complex samples.

12. The method of claim 10, wherein encoding the complex samples comprises:
adding the one or more time domain complex samples to an end or a start of the complex samples of the data.

13. The method of claim 10, wherein the one or more time domain complex samples are redundant samples or parity samples of the data.

14. The method of claim 10, wherein encoding the complex samples comprises:
adding the one or more time domain complex samples to the complex samples to obtain the encoded data; and
compressing the encoded data after adding the one or more time domain complex samples.

15. The method of claim 10, wherein encoding the complex samples comprises:
compressing the complex samples to obtain compressed complex samples; and
adding the one or more time domain complex samples to the compressed complex samples.

16. The method of claim 10, wherein the known value is zero.

17. The method of claim 10, wherein transmitting the encoded data comprises:
transmitting the encoded data via a fronthaul link.

18. The method of claim 10, wherein the one or more time domain complex samples are scaled time domain complex samples.

19. A non-transitory computer-readable medium storing a set of instructions for wireless communication, the set of instructions comprising:
one or more instructions that, when executed by one or more processors of a first wireless communication device, cause the first wireless communication device to:
encode complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and transmit, to a second wireless communication device, the encoded data.

20. The non-transitory computer-readable medium of claim 19, wherein the function is a discrete Fourier transform (DFT) of the one or more time domain complex samples.

21. The non-transitory computer-readable medium of claim 19, wherein the one or more instructions, that cause the first wireless communication device to encode the complex samples, cause the first wireless communication device to:

add the one or more time domain complex samples to an end or a start of the complex samples of the data.

22. The non-transitory computer-readable medium of claim 19, wherein the one or more time domain complex samples are redundant samples or parity samples of the data.

23. The non-transitory computer-readable medium of claim 19, wherein the one or more instructions, that cause the first wireless communication device to encode the complex samples, cause the first wireless communication device to:

add the one or more time domain complex samples to the complex samples to obtain the encoded data; and compress the encoded data after adding the one or more time domain complex samples.

24. The non-transitory computer-readable medium of claim 19, wherein the one or more instructions, that cause the first wireless communication device to encode the complex samples, cause the first wireless communication device to:

compress the complex samples to obtain compressed complex samples; and add the one or more time domain complex samples to the compressed complex samples.

25. An apparatus for wireless communication, comprising:

means for encoding complex samples of data to obtain encoded data based at least in part on adding one or more time domain complex samples to the complex samples of the data, wherein a function of the one or more time domain complex samples is a known value, and wherein the function is a sum of exponentials of the one or more time domain complex samples; and means for transmitting, to another apparatus, the encoded data.

26. The apparatus of claim 25, wherein the function is a discrete Fourier transform (DFT) of the one or more time domain complex samples.

27. The apparatus of claim 25, wherein the means for encoding the complex samples comprise:

means for adding the one or more time domain complex samples to an end or a start of the complex samples of the data.

28. The apparatus of claim 25, wherein the one or more time domain complex samples are redundant samples or parity samples of the data.

29. The apparatus of claim 25, wherein the means for encoding the complex samples comprise:

means for adding the one or more time domain complex samples to the complex samples to obtain the encoded data; and means for compressing the encoded data after adding the one or more time domain complex samples.

30. The apparatus of claim 25, wherein the means for encoding the complex samples comprise:

means for compressing the complex samples to obtain compressed complex samples; and means for adding the one or more time domain complex samples to the compressed complex samples.

* * * * *